United States Patent [19]
Yamada

[11] Patent Number: 5,895,944
[45] Date of Patent: Apr. 20, 1999

[54] CHARGE COUPLED DEVICE IMAGE SENSOR AND METHOD OF DRIVING THE SAME

[75] Inventor: Tohru Yamada, Tokyo, Japan

[73] Assignee: NEC Corporation, Japan

[21] Appl. No.: 08/963,928

[22] Filed: Nov. 4, 1997

[30] Foreign Application Priority Data

Nov. 8, 1996 [JP] Japan .................................. 8-296760

[51] Int. Cl.$^6$ .................... H01L 27/148; H01L 29/768
[52] U.S. Cl. ...................... 257/233; 257/250; 257/435
[58] Field of Search .................................. 257/232, 233, 257/250, 435

[56] References Cited

U.S. PATENT DOCUMENTS

| | | | |
|---|---|---|---|
| 5,250,825 | 10/1993 | Negishi et al. | 257/250 |
| 5,255,099 | 10/1993 | Orihara | 257/232 |
| 5,256,890 | 10/1993 | Furukawa et al. | 257/435 |
| 5,256,891 | 10/1993 | Losee et al. | 257/233 |
| 5,399,888 | 3/1995 | Nakashiba | 257/233 |
| 5,723,884 | 3/1998 | Kim | 257/435 |

FOREIGN PATENT DOCUMENTS

| | | | |
|---|---|---|---|
| 62-208668 | 9/1987 | Japan | H01L 27/14 |
| 63-174359 | 7/1988 | Japan | H01L 27/14 |
| 7176714 | 7/1995 | Japan | H01L 27/148 |
| 7211883 | 8/1995 | Japan | H01L 27/148 |
| 821705 | 3/1996 | Japan | H01L 27/14 |
| 9331056 | 12/1997 | Japan | H01L 27/148 |

OTHER PUBLICATIONS

"A 1/2-in 330K Progressive-Scan CCD Image Sensor with Square-Pixel" K. Nakashima et al ITE Technical Report, vol. 18, No. 67, pp. 7-12, Nov. 1994.

"A 1/3-inch 330K Square-Pixel Progressive-Scan IT-CCD Image Sensor" T. Okutani et al 1995 ITE Anual Covention, pp. 93-94.

Primary Examiner—Gene M. Munson
Attorney, Agent, or Firm—Hayes, Soloway, Hennessey, Grossman & Hage, P.C.

[57] ABSTRACT

There is provided an imager sensor including a semiconductor substrate, a plurality of photodiode regions arranged on the semiconductor substrate in row and column directions, a plurality of charge transfer regions each disposed at a space between the photodiode regions in the row direction, the charge transfer regions transferring in the row direction signal charges generated from the photodiode regions, and an electrically conductive photoshield film covering the charge transfer regions therewith. Each of the charge transfer regions includes at least three independent transfer electrodes per a photodiode region. At least one of the three independent transfer electrodes is surrounded by the photodiode region to thereby have an isolated island shape, the rest of the transfer electrodes extend through a space between the photodiode regions in the column direction, and make electrical connection with a bus line disposed outside the semiconductor substrate. The electrically conductive photoshield film makes electrical connection with both the island-shaped transfer electrodes and the bus line. The image sensor has the less number of steps and more excellent optical characteristics than conventional ones.

50 Claims, 9 Drawing Sheets

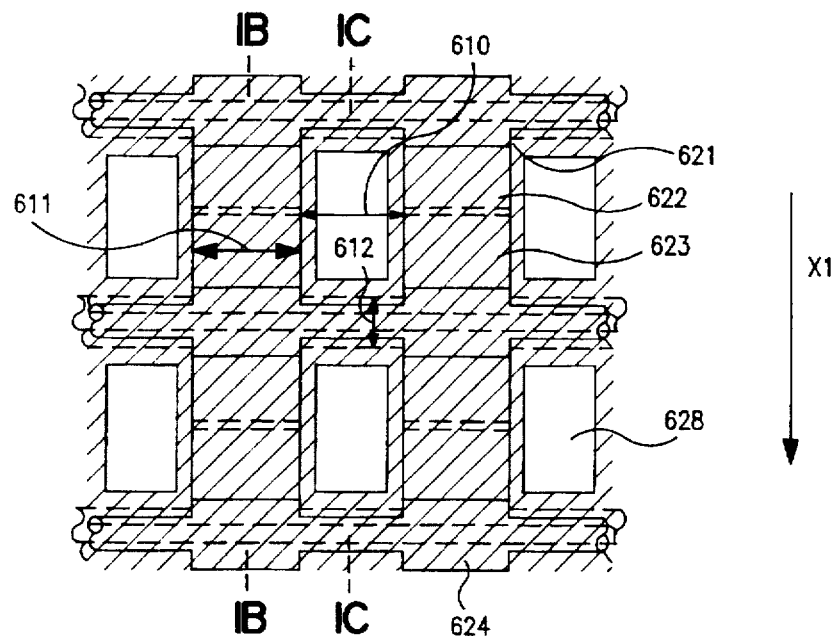
FIG. IA
PRIOR ART
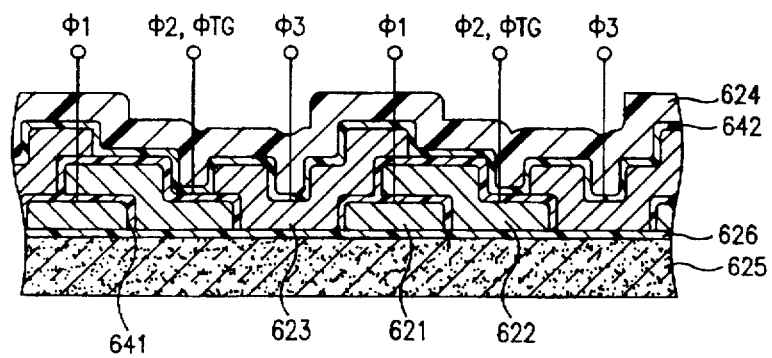
FIG. IB
PRIOR ART
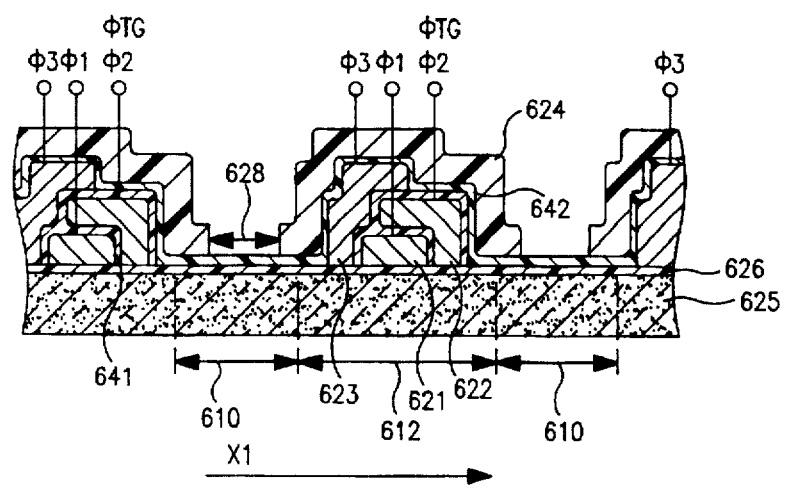
FIG. IC
PRIOR ART

CHARGE COUPLED DEVICE IMAGE SENSOR AND METHOD OF DRIVING THE SAME

BACKGROUND OF THE INVENTION

1. Field of the Invention

The invention relates to a progressive-scan image sensor used for a computer inputting camera and a digital still camera, and also to a method of driving the same.

2. Description of the Related Art

In recent years, an image-inputting device such as a computer inputting camera and a digital still camera has been actively developed. Since an image sensor used for such an image inputting device is required to have images having high vertical resolution by single exposure, it is preferable to adopt a progressive-scan type in place of an interlace type for scanning a screen. A progressive-scan image sensor is designed to include at least three independent transfer electrodes per a unit pixel in order to read out signal charges in all pixels at a time. In a conventional method, at least three-phase driving pulse signals are applied to those transfer electrodes.

An example of a progressive-scan image sensor is found in "A ½-in 330K Progressive-Scan CCD Image Sensor with Square-Pixel", K. Nakashima et al., ITE Technical Report, Vol. 18, No. 67, pp. 7–12, November 1994, or in "A ½-inch 330K Square-Pixel Progressive-Scan IT-CCD Image Sensor", T. Okutani et al., 1995 ITE Annual Convention, pp. 93–94. As described in those reports, an image sensor is characterized to have a transfer electrode comprised of a three-layered gate electrode film.

Another example of a progressive-scan image sensor has been suggested in Japanese Patent Publication No. 8-21705. The suggested progressive-scan image sensor is a charge coupled type image sensor where a transfer electrode is designed to have an island shape, and an electrically conductive wiring is connected to the island-shaped transfer electrode.

Hereinbelow is explained the firstly mentioned conventional progressive-scan image sensor with reference to FIGS. 1A to 1C. FIG. 1A is a schematic view illustrating the firstly mentioned conventional progressive-scan image sensor, FIG. 1B is a cross-sectional view taken along the line IB—IB, and FIG. 1C is a cross-sectional view taken along the line IC—IC in FIG. 1A.

The illustrated image sensor is of an interline type image sensor comprising photodiode regions 610, and charge transfer regions 611 for reading signal charges photoelectrically converted in the photodiode regions 610, and transferring the thus photoelectrically converted signal charges in a vertical transfer direction X1. The photodiode regions 610 are spaced away from one another in the direction X1. Hereinafter, spaces formed between the photodiode regions 610 in the direction X1 are referred to as connection portions 612.

Each of transfer electrodes is comprised of three layers per a pixel. Namely, as illustrated in FIGS. 1B and 1C, transfer electrodes 621, 622 and 623 comprised of first, second and third layers, respectively, are formed on a semiconductor substrate 625 in the charge transfer regions 611 and the connection portions 612 with a gate insulating film 626 sandwiched between the transfer electrodes 621, 622, 623 and the semiconductor substrate 625.

Between the transfer electrodes 621, 622 and 623 are formed an interlayer insulating film 641 such as a thermal oxide film. All the transfer electrodes 621, 622 and 623 extend through the connection portions 612, and make electrical connection with a bus line (not illustrated) disposed around the semiconductor substrate 625.

When charges are transferred, a first phase driving pulse $\phi 1$ is applied to the transfer electrode 621 made of the first layer, a second phase driving pulse $\phi 2$ is applied to the transfer electrode 622 made of the second layer, and a third phase driving pulse $\phi 3$ is applied to the transfer electrode 623 made of the third layer. When a signal charge is read out from the photodiode region 610 to the charge transfer region 611, a read-out pulse $\phi TG$ in addition to a driving pulse is applied to one of the three transfer electrodes 621, 622 and 623, for instance, to the transfer electrode 622 made of the second layer.

As illustrated in FIGS. 1B and 1C, the three transfer electrodes 621, 622 and 623 and the semiconductor substrate 625 are covered with an interlayer insulating film 642 such as a thermal oxide film and an oxide film formed by chemical vapor deposition (hereinafter, referred to simply as "CVD"). In addition, a photoshield film 624 is formed on the interlayer insulating film 642 above the transfer electrodes 621, 622 and 623 for preventing lights from directly entering the charge transfer regions 611. As illustrated in FIG. 1C, the photoshield film 624 is formed with openings 628 between the transfer electrodes 621, 622 and 623 in the direction X1. The photoshield film 624 is grounded, or is designed to be fixed at a certain voltage, and has a function of only preventing lights from passing therethrough.

Thus, the firstly mentioned conventional progressive-scan image sensor has provided a three-layered electrode, three-phase driving type progressive-scan image sensor.

Hereinbelow is explained the secondly mentioned conventional progressive-scan image sensor with reference to FIGS. 2A to 2C. FIG. 2A is a schematic view illustrating the secondly mentioned conventional progressive-scan image sensor, FIG. 2B is a cross-sectional view taken along the line IIB—IIB, and FIG. 2C is a cross-sectional view taken along the line IIC—IIC in FIG. 2A.

The illustrated image sensor is of an interline type image sensor comprising photodiode regions 710, and charge transfer regions 711 for reading signal charges photoelectrically converted in the photodiode regions 710, and transferring the thus photoelectrically converted signal charges in a vertical transfer direction X1. The photodiode regions 710 are spaced away from one another in the direction X1. Hereinafter, spaces formed between the photodiode regions 710 in the direction X1 are referred to as connection portions 712.

Each of transfer electrodes is comprised of four sections per a pixel. Namely, as illustrated in FIGS. 2B and 2C, a transfer electrode 721 made of a first layer, transfer electrodes 722a and 722b made of a second layer, and a transfer electrode 723 made of a third layer are formed on a semiconductor substrate 725 in the charge transfer regions 711 and the connection portions 712 with a gate insulating film 726 sandwiched between the transfer electrodes 721, 722a, 722b, 723 and the semiconductor substrate 725.

Between the transfer electrodes 721, 722a, 722b and 723 are formed interlayer insulating films 741 such as a thermal oxide film. All the transfer electrodes 721, 722a, 722b and 723 extend through the connection portions 712, and make electrical connection with a bus line (not illustrated) disposed around the semiconductor substrate 725.

When charges are transferred, a first phase driving pulse $\phi 1$ is applied to the transfer electrode 721 made of the first layer, a second phase driving pulse φ2 is applied to the transfer electrode 722a made of the second layer, a third phase driving pulse φ3 is applied to the transfer electrode 723 made of the third layer, and a fourth phase driving pulse φ4 is applied to the transfer electrode 722b made of the second layer. When a signal charge is read out from the photodiode region 710 to the charge transfer region 711, a read-out pulse φTG in addition to a driving pulse is applied to one of those four transfer electrodes 721, 722a, 722b and 723, for instance, to the transfer electrode 723 made of the third layer.

As illustrated in FIGS. 2B and 2C, the four transfer electrodes 721, 722a, 722b and 723 and the semiconductor substrate 725 are covered with an interlayer insulating film 742 such as a thermal oxide film and an oxide film formed by CVD. In addition, a photoshield film 724 is formed on the interlayer insulating film 742 above the transfer electrodes 721, 722a, 722b and 723 for preventing lights from directly entering the charge transfer regions 711. As illustrated in FIG. 2C, the photoshield film 724 is formed with openings 728 between the transfer electrodes 721, 722a, 722b and 723 in the direction X1. The photoshield film 724 is grounded, or is designed to be fixed at a certain voltage, and has a function of only preventing lights from passing therethrough.

Thus, the secondly mentioned conventional progressive-scan image sensor has provided a three-layered electrode, four-phase driving type progressive-scan image sensor.

Hereinbelow is explained the thirdly mentioned conventional progressive-scan image sensor with reference to FIGS. 3A to 3C. FIG. 3A is a schematic view illustrating the thirdly mentioned conventional progressive-scan image sensor, FIG. 3B is a cross-sectional view taken along the line IIIB–IIIB, and FIG. 3C is a cross-sectional view taken along the line IIIC–IIIC in FIG. 3A.

The illustrated image sensor is of an interline type image sensor comprising photodiode regions 810, and charge transfer regions 811 for reading signal charges photoelectrically converted in the photodiode regions 810, and transferring the thus photoelectrically converted signal charges in a vertical transfer direction X1. The photodiode regions 810 are spaced away from one another in the direction X1. Hereinafter, spaces formed between the photodiode regions 810 in the direction X1 are referred to as connection portions 812.

Each of transfer electrodes is comprised of three sections per a pixel. Namely, as illustrated in FIGS. 3B and 3C, transfer electrodes 821h and 821i made of a first layer and a transfer electrode 822j made of a second layer are formed on a semiconductor substrate 825 in the charge transfer regions 811 and the connection portions 812 with a gate insulating film 826 sandwiched between the transfer electrodes 821h, 821i, 822j and the semiconductor substrate 825.

Between the transfer electrodes 821h, 821i and 822j is formed an interlayer insulating film 841 such as a thermal oxide film. The transfer electrode 822j made of the second layer is surrounded by the photodiode regions 810, and is pattered in the form of an island. The transfer electrodes 821h and 821i other than the island-shaped transfer electrode 822j extend through the connection portions 812, and make electrical connection with a bus line (not illustrated) disposed around the semiconductor substrate 825.

There is formed an electrically conductive wiring layer 830 over the transfer electrodes 821h, 821i and 822j in the direction X1. The electrically conductive wiring layer 830 makes electrical connection with the above-mentioned bus line, and further with the island-shaped transfer electrode 822j through a contact hole 827.

When charges are transferred, a first phase driving pulse φ1 is applied to the electrically conductive wiring layer 830 and hence the island-shaped transfer electrode 822j made of the second layer, a second phase driving pulse φ2 is applied to the transfer electrode 821i made of the first layer, and a third phase driving pulse φ3 is applied to the transfer electrode 821h made of the first layer. When a signal charge is read out from the photodiode region 810 to the charge transfer region 811, a read-out pulse φTG in addition to a driving pulse is applied to one of the three transfer electrodes 821h, 821i and 822j, for instance, to the transfer electrode 822j through the electrically conductive wiring layer 830.

Since the electrically conductive wiring 830 is formed only for the purpose of applying driving pulses to the transfer electrodes, the electrically conductive wiring 830 does not have a function of completely preventing lights from entering the charge transfer regions 811. In an interline transfer type image sensor, a photoshield film 824 has to be formed covering the charge transfer regions 811 therewith in order to prevent lights from directly entering the charge transfer regions 811. Accordingly, there has to be formed the photoshield film 824 over the electrically conductive wiring layer 830 in the thirdly mentioned conventional image sensor, as illustrated in FIGS. 3B and 3C.

The thirdly mentioned conventional image sensor has to have totally four films, similarly to the firstly and secondly mentioned conventional image sensors: first and second layers for forming the transfer electrodes 821h, 821i and 822j thereof; a layer for forming the electrically conductive wiring layer 830 for applying driving pulses to the island-shaped transfer electrode 822j; and the photoshield film 824 for preventing lights from entering the photodiode regions 810.

As mentioned above, the conventional progressive-scan image sensors include totally four films. Specifically, the firstly and secondly mentioned image sensors include three films for forming transfer electrodes thereof and a film for forming a photoshield film thereof, and the thirdly mentioned image sensor includes two films for forming transfer electrodes thereof, a film for forming an electrically conductive wiring layer, and a film for forming a photoshield film thereof. The four-film structure causes problems as follows.

The first problem is as follows. The four-film structure causes an enormous interlayer capacity, which is accompanied of higher power consumption in charge transfer regions. Herein, power consumption is defined as $CV^2f$ wherein C indicates a parasitic capacity of a transfer electrode, V indicates a driving voltage, and f indicates a driving frequency.

The second problem is as follows. The increased interlayer capacity causes driving pulses applied to transfer electrodes and a read-out pulse to become dull in a waveform thereof in accordance with a time constant defined as a product C×R where C indicates a parasitic capacity of a transfer electrode, and R indicates a resistance of a transfer electrode. This in turn causes a problem that improper transfer and/or incorrect read-out tends to occur.

The third problem is an increase in smear. As a cell becomes smaller in size, an aspect ratio becomes greater, and as a result, apparent steps also become larger. Hence, smear would be increased due to deterioration in sensitivity caused by improper light-collection and further due to reflection and diffusion of incident lights.

The fourth problem is as follows. As the steps become larger, it would become difficult to properly form transfer electrodes and a photoshield film. This causes a problem that transfer electrodes and a photoshield film tend to be short-circuited, resulting in a problem of reduction in a fabrication yield of a device.

The fifth problem is as follows. As the steps become larger, it would be difficult to properly form an on-chip color filter and/or an on-chip micro-lens formed subsequently formation of a photoshield film. This causes reduction in sensitivity, non-uniformity in sensitivity in a plane of a chip, and color mixture among pixels.

The sixth problem is that since there has to be formed at least totally four films, three films for forming transfer electrodes and a film for forming a photoshield film, the greater number of fabrication steps have to be carried out, resulting in an increase in fabrication costs.

SUMMARY OF THE INVENTION

In view of the foregoing problems of the conventional progressive-scan image sensor, it is an object of the present invention to provide a progressive-scan image sensor capable of solving the above-mentioned problems, having the smaller number of steps in a structure thereof, being fabricated at lower costs and at lower power consumption, and having excellent optical characteristic. It is also an object of the present invention to provide a method of driving the above-mentioned progressive-scan image sensor.

In one aspect of the invention, there is provided an imager sensor including (a) a semiconductor substrate, (b) a plurality of photodiode regions arranged on the semiconductor substrate in row and column directions, (c) a plurality of charge transfer regions each disposed at a space between the photodiode regions in the row direction, the charge transfer regions transferring in the row direction signal charges generated from the photodiode regions, and (d) an electrically conductive photoshield film covering the charge transfer regions therewith. Each of the charge transfer regions includes at least two layers from which transfer electrodes are formed, and further includes at least three independent transfer electrodes per a photodiode region. At least one of the three independent transfer electrodes is surrounded by the photodiode regions to be formed in an isolated island shape, and the rest of the three independent transfer electrodes extend through a space between the photodiode regions in the column direction, and make electrical connection with a bus line disposed outside the semiconductor substrate. The electrically conductive photoshield film makes electrical connection with both the island-shaped transfer electrode and the bus line. A driving pulse is applied through the electrically conductive photoshield film.

For instance, the electrically conductive photoshield film makes electrical connection with the island-shaped transfer electrode through a contact hole.

It is preferable for an interlayer film formed between the electrically conductive photoshield film and the transfer electrodes to a dielectric constant smaller than 3.9. As an alternative, it is preferable for an interlayer film formed between the electrically conductive photoshield film and the transfer electrodes to have a smaller dielectric constant than that of a silicon dioxide film. For instance, the interlayer film may be an amorphous carbon film, or a SiOF film. The interlayer film has preferably a thickness in the range of 1000 angstroms to 3000 angstroms both inclusive.

There is further provided an imager sensor including (a) a semiconductor substrate, (b) a plurality of photodiode regions arranged on the semiconductor substrate in row and column directions, (c) a plurality of charge transfer regions each disposed at a space between the photodiode regions in the row direction, the charge transfer regions transferring in the row direction signal charges generated from the photodiode regions, and (d) an electrically conductive photoshield film covering the charge transfer regions therewith. Each of the charge transfer regions includes at least two layers from which transfer electrodes are formed, and further includes six independent transfer electrodes per two photodiode regions in the row direction. The transfer electrodes disposed at (6N+1)th and (6N+4)th columns where N is zero or a positive integer are surrounded by the photodiode regions to thereby be formed in an isolated island shape, and make electrical connection with the electrically conductive photoshield film. The rest of the six independent transfer electrodes extend through a space between the photodiode regions in the column direction, and make electrical connection with a bus line disposed outside the semiconductor substrate. A driving pulse is applied through the electrically conductive photoshield film. The transfer electrodes disposed at (6N+1)th, (6N+3)th and (6N+5)th columns are formed of a first gate electrode film, and the transfer electrodes disposed at (6N+2)th, (6N+4)th and (6N+6)th columns are formed of a second gate electrode film.

For instance, the transfer electrodes disposed at (6N+1)th and (6N+4)th columns may make electrical connection with the electrically conductive photoshield film through a contact hole. The transfer electrodes disposed at (6N+2)th, (6N+4)th and (6N+6)th columns may be formed in spaces between the transfer electrodes disposed at (6N+1)th, (6N+3)th and (6N+5)th columns.

It is preferable that the electrically conductive photoshield film disposed above the space between the photodiode regions in the column direction has a width in the range of 0.5 μm to 2 μm both inclusive. The electrically conductive photoshield film may be formed in stripes in the row direction so as to cover only the charge transfer regions. The electrically conductive photoshield film may be formed so as to cover the charge transfer regions and the space between the photodiode regions in the column direction, and so as to have openings above the photodiode regions. As an alternative, the electrically conductive photoshield film on the transfer electrodes formed of the second gate electrode film may be formed so as to cover a sidewall of the transfer electrodes formed of the first gate electrode film.

There is still further provided an imager sensor including (a) a semiconductor substrate, (b) a plurality of photodiode regions arranged on the semiconductor substrate in row and column directions, (c) a plurality of charge transfer regions each disposed at a space between the photodiode regions in the row direction, the charge transfer regions transferring in the row direction signal charges generated from the photodiode regions, and (d) an electrically conductive photoshield film covering the charge transfer regions therewith. Each of the charge transfer regions includes at least two layers from which transfer electrodes are formed, and further includes four independent transfer electrodes per a photodiode region. The transfer electrode disposed at (4N+1)th column where N is zero or a positive integer is surrounded by the photodiode regions to be formed in an isolated island shape, and making electrical connection with the electrically conductive photoshield film, and the rest of the four independent transfer electrodes extend through a space between the photodiode regions in the column direction, and make electrical connection with a bus line disposed outside the semiconductor substrate. A driving pulse is applied through the electrically conductive photoshield film. The transfer electrodes disposed at (4N+1)th and (4N+3)th columns are formed of a first gate electrode film, and the transfer electrodes disposed at (4N+2)th and (4N+4)th columns are formed of a second gate electrode film.

For instance, the transfer electrode disposed at (4N+1)th column may make electrical connection with the electrically conductive photoshield film through a contact hole. The transfer electrodes disposed at (4N+1)th and (4N+3)th columns may be formed in spaces between the transfer electrodes disposed at (4N+2)th and (4N+4)th columns.

There is yet further provided an imager sensor including (a) a semiconductor substrate, (b) a plurality of photodiode regions arranged on the semiconductor substrate in row and column directions, (c) a plurality of charge transfer regions each disposed at a space between the photodiode regions in the row direction, the charge transfer regions transferring in the row direction signal charges generated from the photodiode regions, and (d) an electrically conductive photoshield film covering the charge transfer regions therewith. Each of the charge transfer regions includes at least two layers from which transfer electrodes are formed, and further includes four independent transfer electrodes per a photodiode region. The transfer electrodes disposed at (4N+1)th and (4N+2)th columns where N is zero or a positive integer are surrounded by the photodiode regions to be formed in an isolated island shape, and make electrical connection with the electrically conductive photoshield film. The transfer electrodes disposed at (4N+3)th and (4N+4)th columns extend through a space between the photodiode regions in the column direction, and make electrical connection with a bus line disposed outside the semiconductor substrate. A driving pulse is applied through the electrically conductive photoshield film. The transfer electrodes disposed at (4N+2)th and (4N+4)th columns are formed of a first gate electrode film, and the transfer electrodes disposed at (4N+1)th and (4N+3)th columns are formed of a second gate electrode film. The image sensor further includes potential barrier regions in the semiconductor substrate below the transfer electrodes disposed at (4N+1)th and (4N+3)th columns.

For instance, the transfer electrodes disposed at (4N+1)th and (4N+2)th columns may make electrical connection with the electrically conductive photoshield film through a contact hole.

The potential barrier regions may be formed by ion-implanting impurities into the semiconductor substrate in self-aligned manner about the transfer electrodes disposed at (4N+2)th and (4N+4)th columns.

In another aspect of the present invention, there is provided a method of driving the above secondly mentioned image sensor, including the steps of (a) applying a first phase driving pulse to the transfer electrodes disposed at (6N+1)th and (6N+4)th columns, (b) applying a second phase driving pulse to the transfer electrodes disposed at (6N+2)th and (6N+5)th columns, and (c) applying a third phase driving pulse to the transfer electrodes disposed at (6N+3)th and (6N+6)th columns.

For instance, a read-out pulse may be applied to the transfer electrodes disposed at (6N+1)th and (6N+4)th columns through the electrically conductive photoshield film to read signal charges from the photodiode region including the transfer electrodes disposed at (6N+1)th and (6N+4)th columns.

There is further provided a method of driving the above thirdly mentioned imager sensor, including the steps of (a) applying a first phase driving pulse to the transfer electrode disposed at (4N+1)th column, (b) applying a second phase driving pulse to the transfer electrode disposed at (4N+2)th column, (c) applying a third phase driving pulse to the transfer electrode disposed at (4N+3)th column, and (d) applying a first phase driving pulse to the transfer electrode disposed at (4N+4)th column.

For instance, a read-out pulse may be applied to the transfer electrode disposed at (4N+1)th column through the electrically conductive photoshield film to read signal charge from the photodiode region including the transfer electrode disposed at (4N+1)th column.

There is still further provided a method of driving the above fourthly mentioned imager sensor, including the steps of (a) applying a first phase driving pulse to the transfer electrodes disposed at (4N+1)th and (4N+2)th columns, and (b) applying a second phase driving pulse to the transfer electrodes disposed at (4N+3)th and (4N+4)th columns.

For instance, a read-out pulse may be applied to the transfer electrodes disposed at (4N+1)th and (4N+2)th columns through the electrically conductive photoshield film to read signal charges from the photodiode region including the transfer electrodes disposed at (4N+1)th and (4N+2)th columns.

In accordance with the present invention, at least one transfer electrode per a unit pixel is surrounded by the photodiode regions to thereby be formed in an island shape. By electrically connecting the electrically conductive photoshield film with the island-shaped transfer electrode and further with a bus line disposed around the semiconductor substrate, it is possible to apply a driving pulse to the island-shaped transfer electrode without using a specific wiring layer for connecting the island-shaped transfer electrode to a bus line. Thus, the number of layers for forming transfer electrodes in charge transfer regions can be reduced.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1A is a plane view illustrating a first example of a conventional image sensor.

FIG. 1B is a cross-sectional view taken along the line IB—IB in FIG. 1A.

FIG. 1C is a cross-sectional view taken along the line IC—IC in FIG. 1A.

9

Figure 2A:
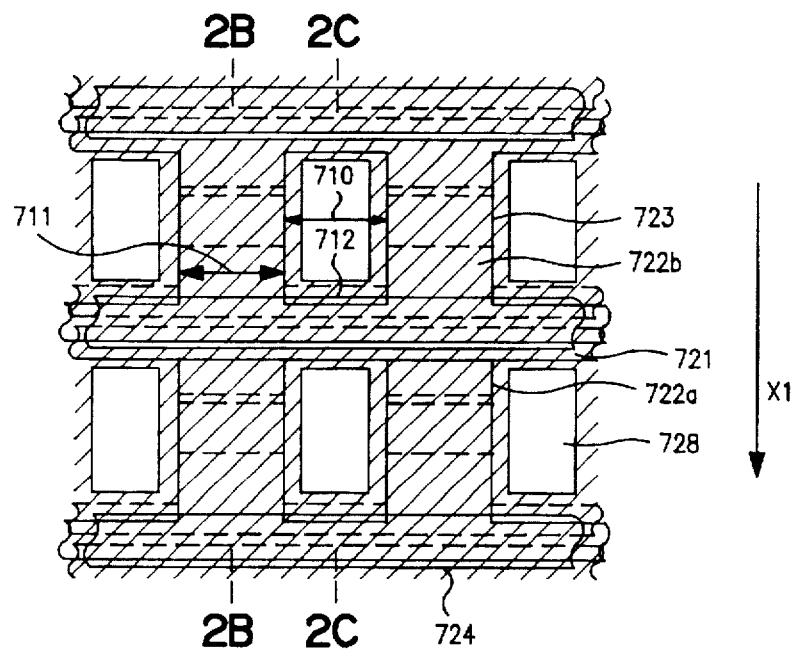
FIG. 2A is a plane view illustrating a second example of a conventional image sensor.
Figure 2B:
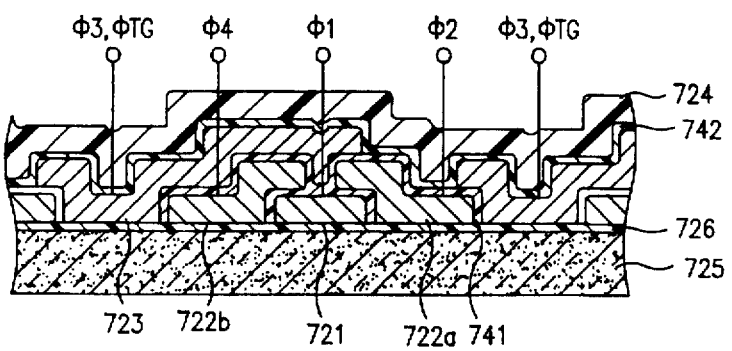
FIG. 2B is a cross-sectional view taken along the line IIB—IIB in FIG. 2A.
Figure 2C:
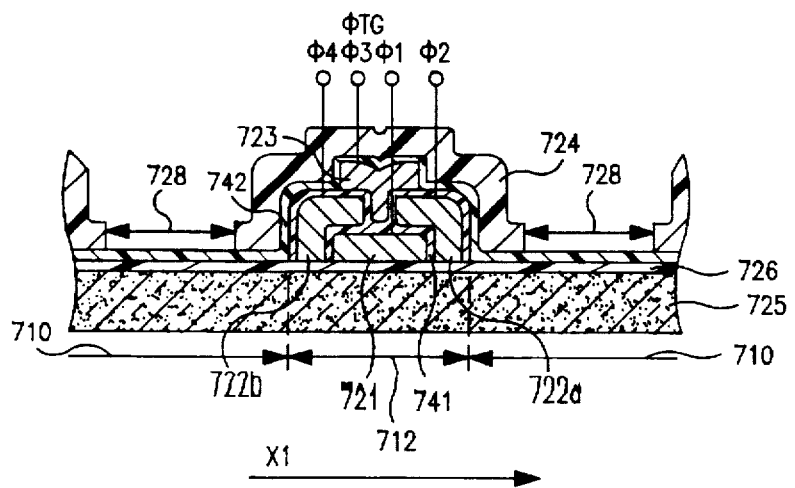
FIG. 2C is a cross-sectional view taken along the line IIC—IIC in FIG. 2A.
Figure 3A:
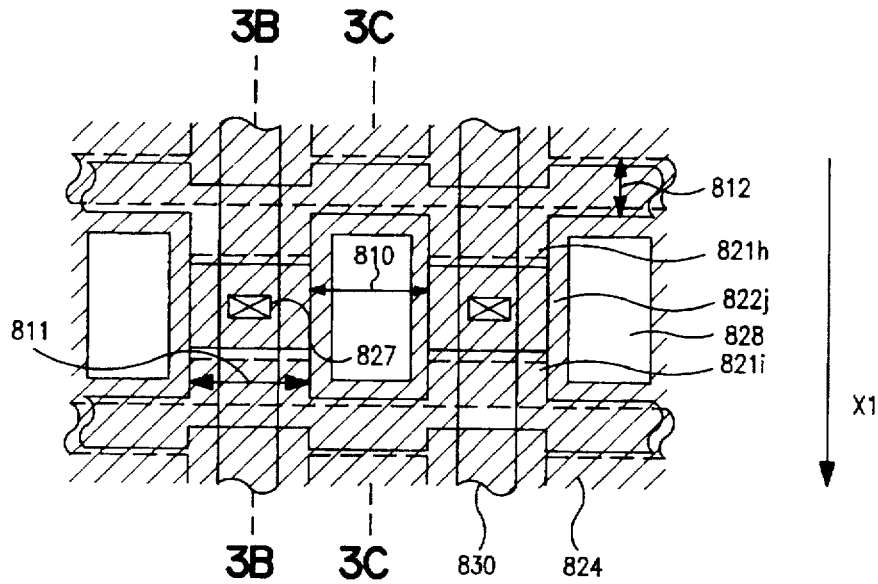
FIG. 3A is a plane view illustrating a third example of a conventional image sensor.
Figure 3B:
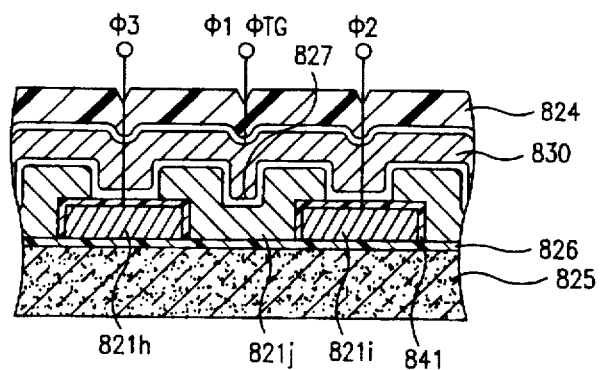
FIG. 3B is a cross-sectional view taken along the line IIIB—IIIB in FIG. 3A.
Figure 3C:
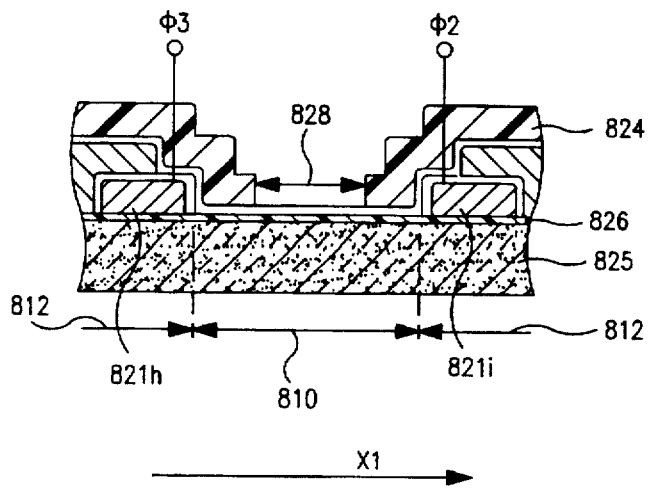
FIG. 3C is a cross-sectional view taken along the line IIIC—IIIC in FIG. 3A.
Figure 4A:
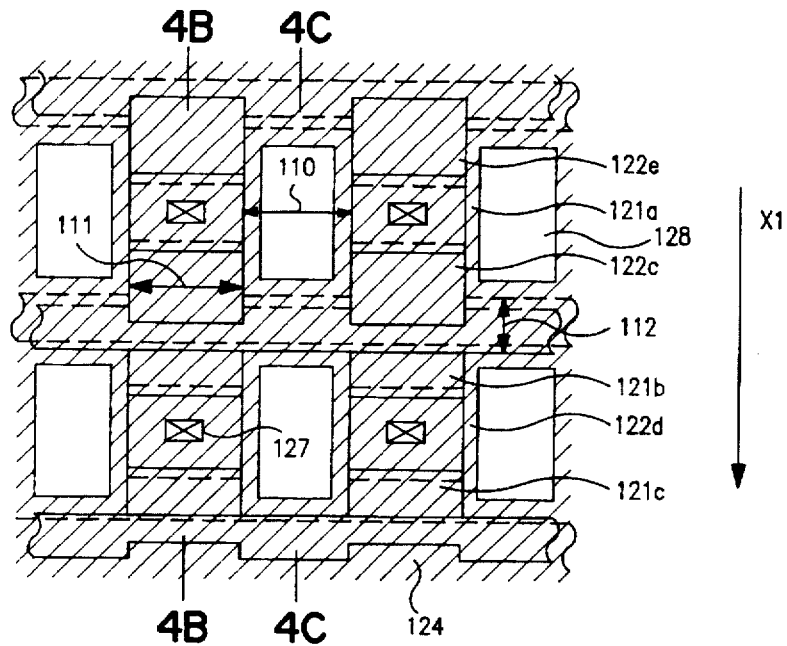
FIG. 4A is a plane view illustrating an image sensor in accordance with the first embodiment of the present invention.
Figure 4B:
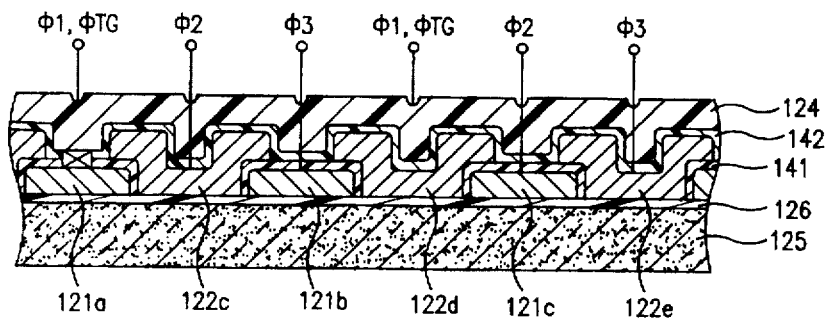
FIG. 4B is a cross-sectional view taken along the line IVB—IVB in FIG. 4A.
Figure 4C:
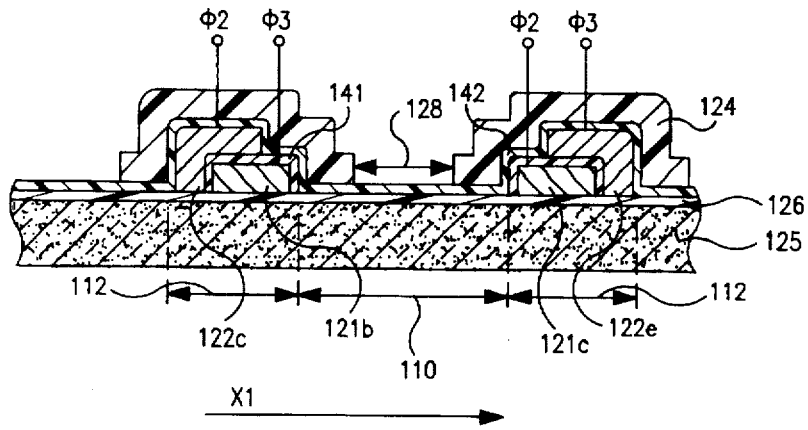

FIG. 4C is a cross-sectional view taken along the line IVC—IVC in FIG. 4A.

Figure 5A:
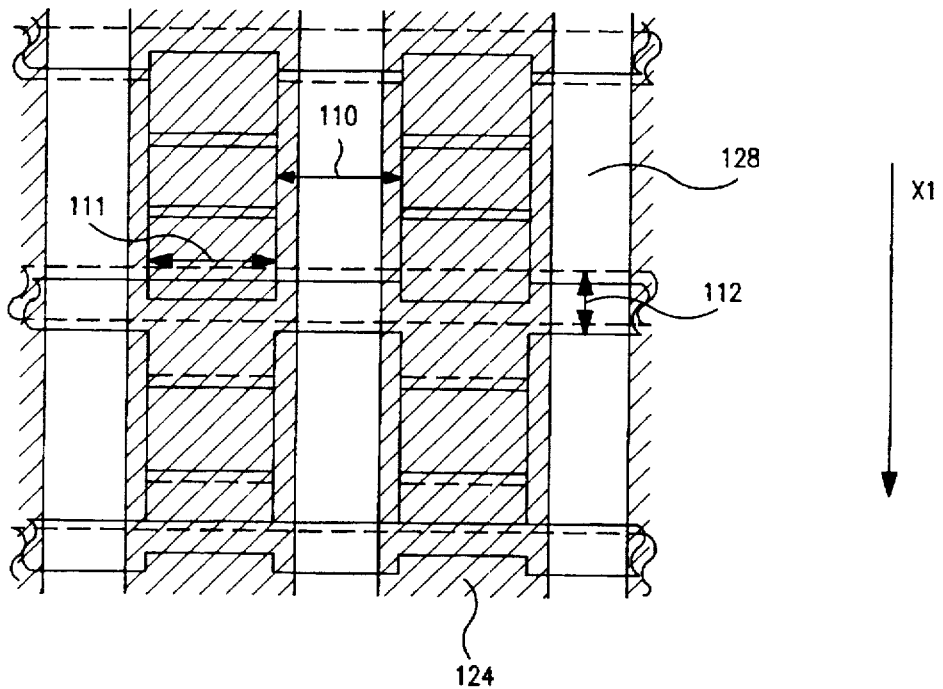

FIG. 5A is a plane view of an electrically conductive photoshield film used in the first embodiment.

Figure 5B:
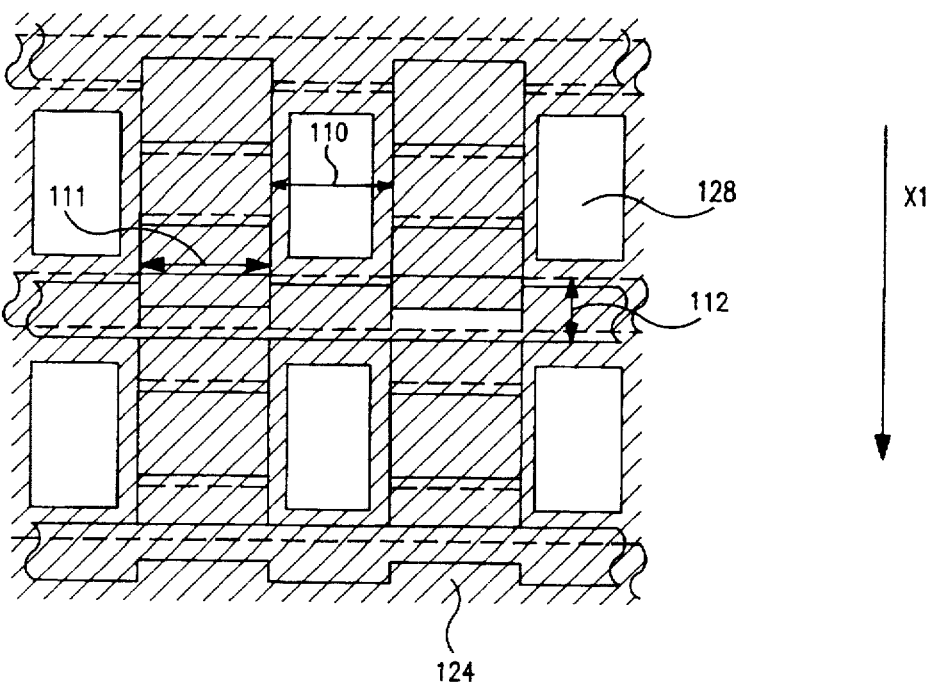

FIG. 5B is a plane view of another electrically conductive photoshield film used in the first embodiment.

Figure 6A:
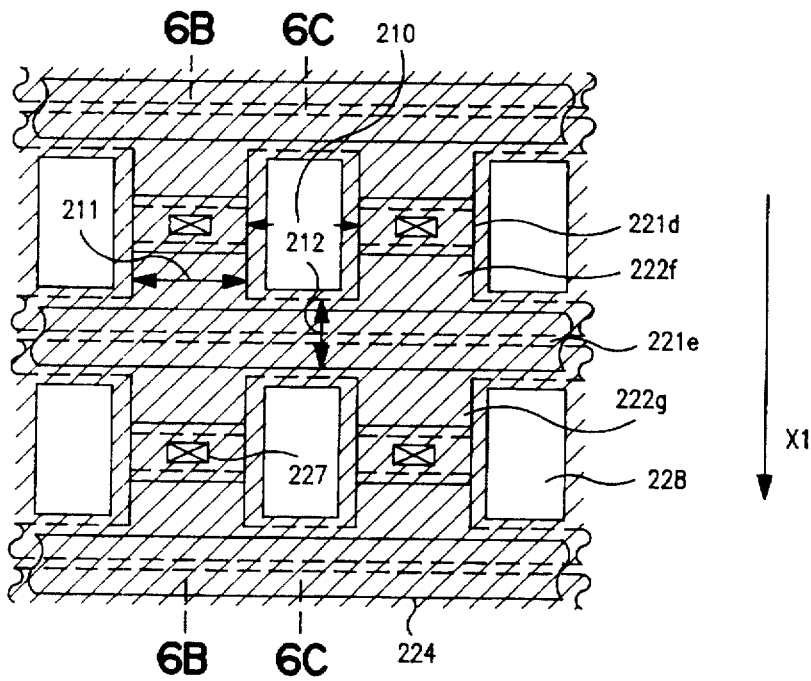

FIG. 6A is a plane view illustrating an image sensor in accordance with the second embodiment of the present invention.

Figure 6B:
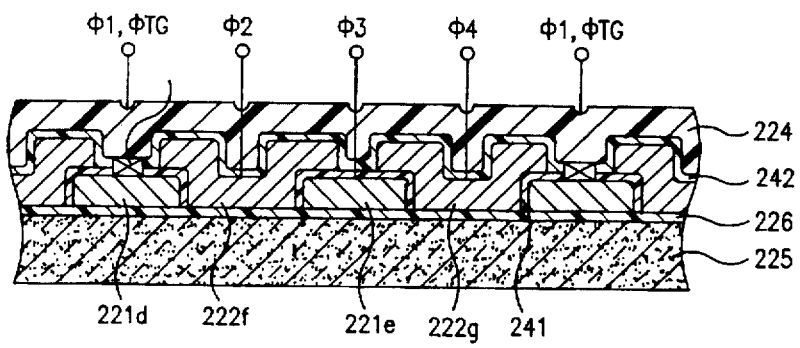

FIG. 6B is a cross-sectional view taken along the line VIB—VIB in FIG. 6A.

Figure 6C:
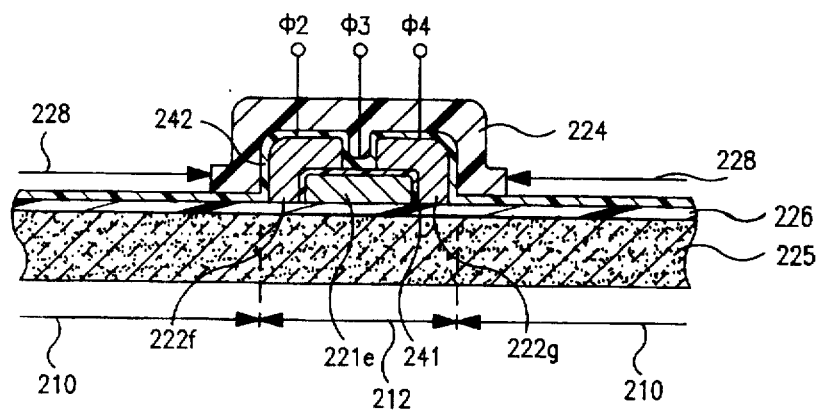

FIG. 6C is a cross-sectional view taken along the line VIC—VIC in FIG. 6A.

Figure 7A:
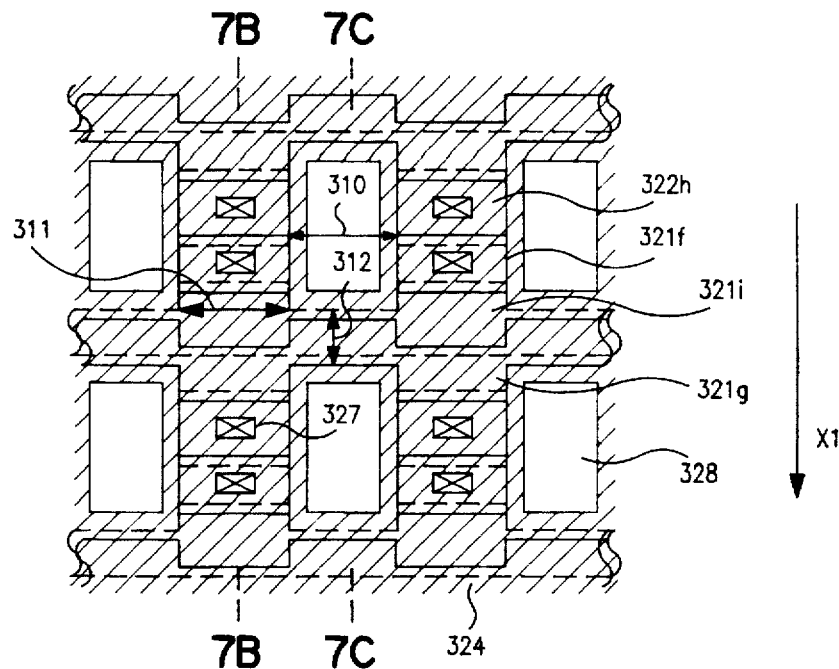

FIG. 7A is a plane view illustrating an image sensor in accordance with the third embodiment of the present invention.

Figure 7B:
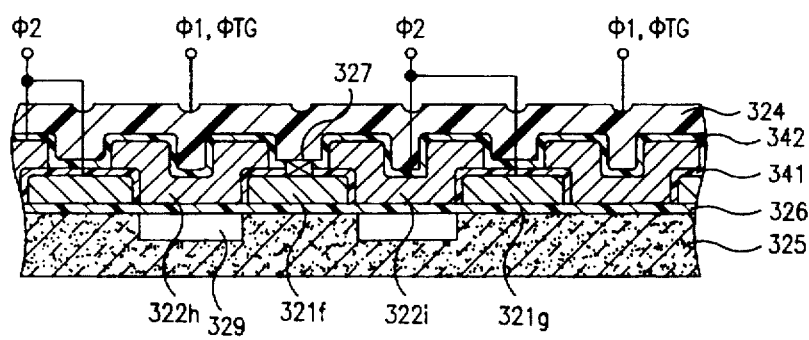

FIG. 7B is a cross-sectional view taken along the line VIIB—VIIB in FIG. 7A.

Figure 7C:
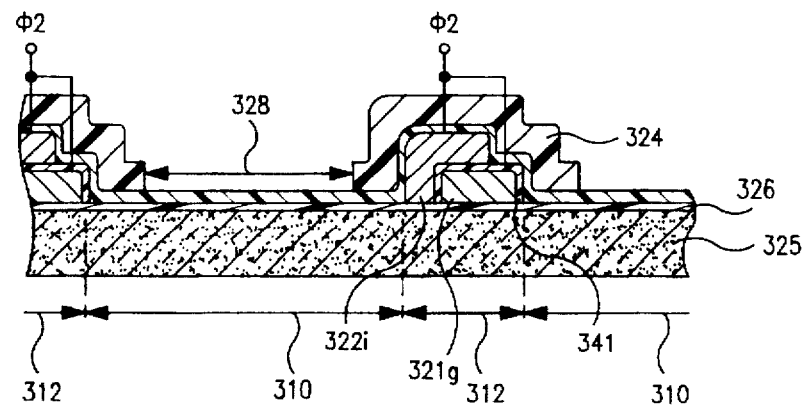

FIG. 7C is a cross-sectional view taken along the line VIIC—VIIC in FIG. 7A.

Figure 8:
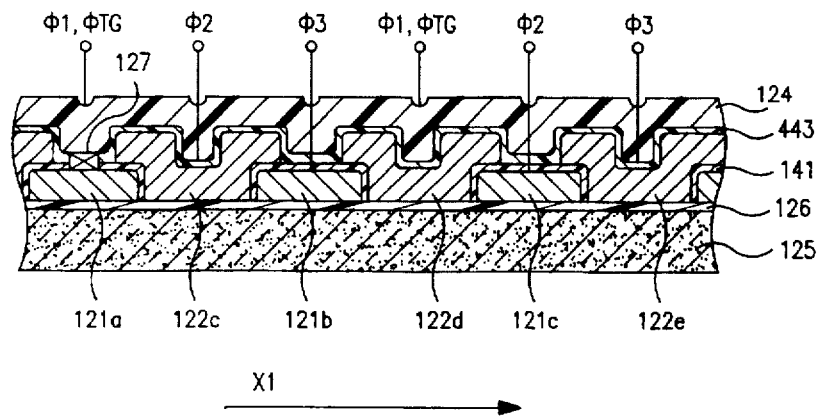

FIG. 8 is a cross-sectional view of an image sensor in accordance with the fourth embodiment of the present invention.

Figure 9:
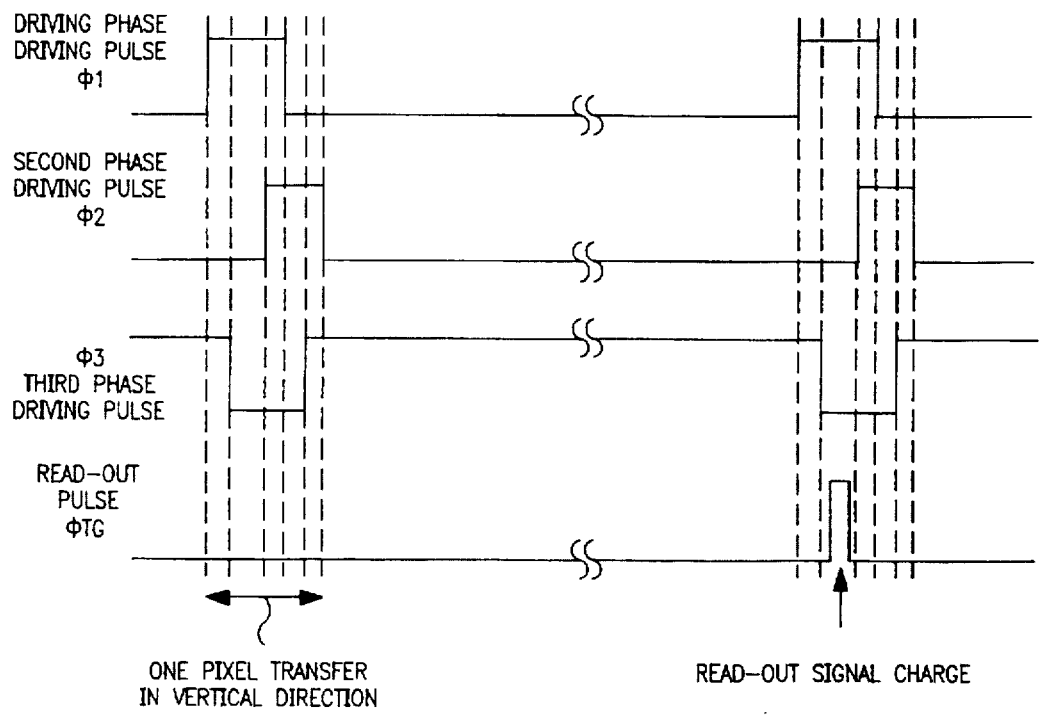

FIG. 9 is a timing chart for explaining operation of the image sensor in accordance with the first embodiment.

Figure 10:
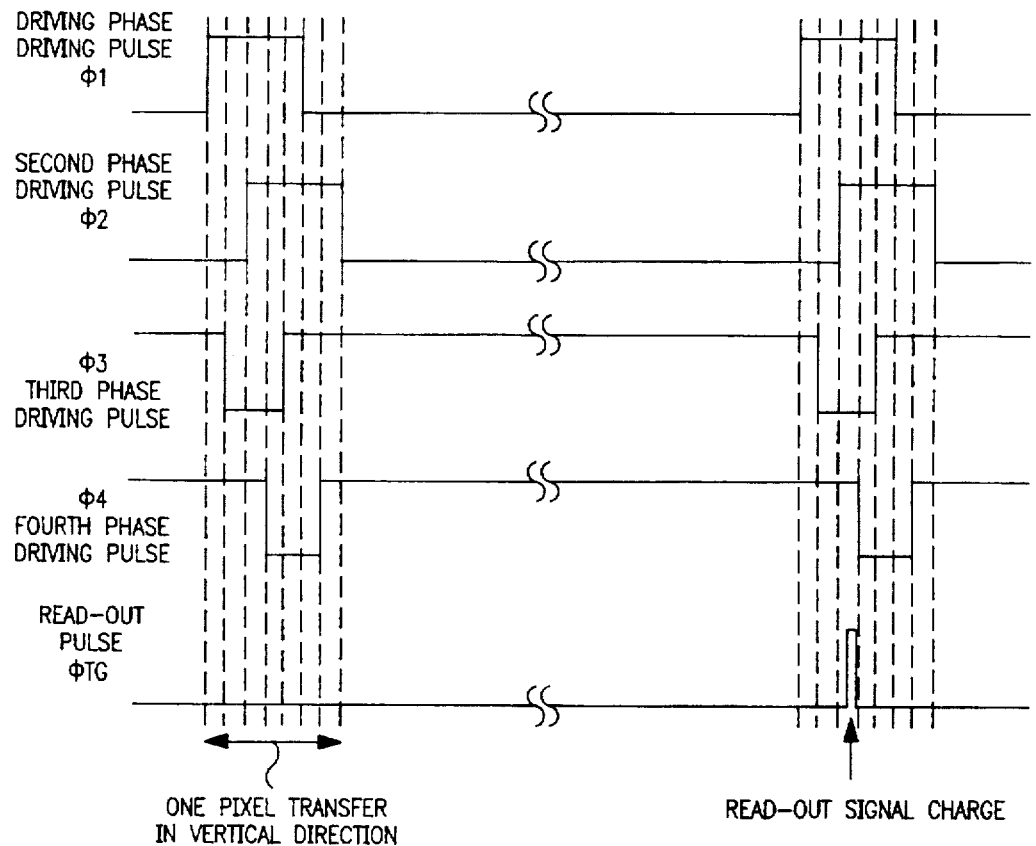

FIG. 10 is a timing chart for explaining operation of the image sensor in accordance with the second embodiment.

Figure 11:
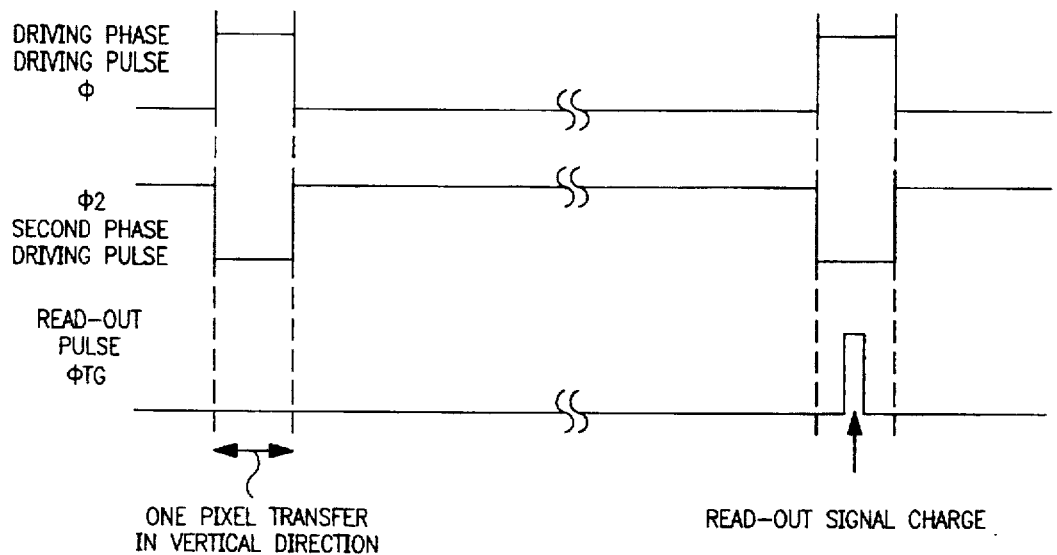

FIG. 11 is a timing chart for explaining operation of the image sensor in accordance with the third embodiment.

DESCRIPTION OF THE PREFERRED EMBODIMENTS

Embodiment 1

An image sensor in accordance with the first embodiment is explained hereinbelow with reference to FIGS. 4A to 4C. With reference to FIG. 4A, the illustrated image sensor is of an interline transfer type image sensor including a plurality of photodiode regions 110, and a plurality of charge transfer regions 111 for reading signal charges photoelectrically converted in the photodiode regions 110, and transferring the thus photoelectrically converted signal charges in a vertical transfer direction indicated with an arrow X1. The photodiode regions 110 and the photodiode regions 111 are spaced away from one another in the direction X1, respectively. Hereinafter, spaces formed between the photodiode regions 110 and also between the photodiode regions 111 in the direction X1 are referred to as connection portions 112.

Each of transfer electrodes is comprised of six sections per two pixels in the direction X1. As illustrated in FIG. 4B, on the connection portion 112 disposed between the adjacent charge transfer regions 111 and also between the adjacent photodiode regions 110 in the direction X1 are formed a transfer electrode 121a disposed at (6N+1)th column, a transfer electrode 121b disposed at (6N+3)th column, and a transfer electrode 121c disposed at (6N+5)th column all of which transfer electrodes are formed of a first gate electrode film. Herein, N is zero or a positive integer. Between the transfer electrodes 121a, 121b and 121c all formed of a first gate electrode film are formed a transfer electrode 122c disposed at (6N+2)th column, a transfer electrode 122d disposed at (6N+4)th column, and a transfer electrode 122e disposed at (6N+6)th column all of which transfer electrodes are formed of a second gate electrode film.

The transfer electrode 121a disposed at (6N+1)th column and the transfer electrode 122d at (6N+4)th column are

10 sandwiched between the photodiode regions 110, and thus are formed in an island shape. The transfer electrodes 121b, 121c, 122c and 122e extend through the connection portions 112, and make electrical connection with a bus line (not illustrated) disposed around a semiconductor substrate 125.

If a wiring layer or a later mentioned electrically conductive photoshield film 124 situated on the connection portions 112 would have a small width, a resistance thereof becomes higher, and hence driving pulses are caused to become dull in a waveform thereof. On the contrary, if the wiring layer would have a great width, openings of the photodiode regions 110 would become narrower with the result of reduction in sensitivity of the wiring layer. Thus, it is preferable that the wiring layer has a width in the range of 0.5 μm to 2 μm both inclusive.

As illustrated in FIG. 4B, there is formed an electrically conductive photoshield film 124 over the transfer electrodes 121a, 121b, 121c, 122c, 122d and 122e so that the charge transfer regions 111 are covered with the electrically conductive photoshield film 124. The electrically conductive photoshield film 124 makes electrical connection with a bus line (not illustrated) disposed around the semiconductor substrate 125, and further makes electrical connection with the island-shaped transfer electrodes 121a and 122d disposed at (6N+1)th and (6N+4)th columns, respectively, through a contact hole 127.

The electrically conductive photoshield film 124 may be formed in stripes in the direction X1 so as to cover only the charge transfer regions 111, as illustrated in FIG. 5A. As an alternative, the electrically conductive photoshield film 124 may be formed so as to cover the charge transfer regions 111 and the connection portions 112, in which case, the electrically conductive photoshield film 124 may be formed with openings 128 above the photodiode regions 110, as illustrated in FIG. 5B.

With reference to FIG. 4B, a gate insulating film 126 such as a thermal oxide film and an oxide-nitride-oxide (ONO) film is formed on the semiconductor substrate 125, and the first layer from which the transfer electrodes 121a, 121b and 121c are formed is formed on the gate insulating film 126. These transfer electrodes 121a, 121b and 121c are formed by forming a gate electrode film of polysilicon or tungsten silicide by CVD, and patterning the gate electrode film by photolithography and dry etching. Then, there is formed an interlayer insulating film 141 over the transfer electrodes 121a, 121b and 121c, for instance, by thermally oxidizing the transfer electrodes 121a, 121b and 121c formed of the first layer.

Thereafter, the transfer electrodes 122c, 122d and 122e constituted of a second layer are formed between the first layer transfer electrodes 121a, 121b and 121c. Then, there is formed an interlayer insulating film 142 over the second layer transfer electrodes 121a, 121b and 121c, for instance, by thermally oxidizing the second layer transfer electrodes 122c, 122d and 122e, or by forming an insulating film by CVD. Then, there is formed the electrically conductive photoshield film 124 over the interlayer insulating film 142 by sputtering or CVD, as illustrated in FIG. 4B. The electrically conductive photoshield film 124 is made of metal such as tungsten and aluminum, or of metal silicide such as tungsten silicide.

As illustrated in FIGS. 4A and 4C, the interlayer insulating film 142 is formed with the contact holes 127 through which the electrically conductive photoshield film 124 makes electrical connection with the transfer electrodes 121a and 122d disposed at (6N+1)th and (6N+4)th columns, respectively. If a channel voltage below the transfer electrodes 121a and 122d were caused to shift away from a channel voltage below other transfer electrodes by making direct, electrical connection between the electrically conductive photoshield film 124 and the transfer electrodes 121a and 122d, there may be formed a layer made of metal such as titanium or of metal nitride such as titanium nitride by sputtering or CVD between the electrically conductive photoshield film 124 and the transfer electrodes 121a and 122d. Such a layer would suppress fluctuation in a channel voltage.

With reference to FIG. 4C, the transfer electrodes 121b and 121c both formed of the first layer are formed on the semiconductor substrate 125 except the photodiode regions 110 with the gate insulating film 126 sandwiched therebetween. The first layer transfer electrodes 121b and 121c are covered with the interlayer insulating film 141. The transfer electrodes 122c and 122e formed of the second layer are formed on the interlayer insulating film 141 above the first layer transfer electrodes 121b and 121c. With respect to the wiring layers situated above the connection portions 112 of the second layer transfer electrodes 122c and 122e, the wiring layers may be formed so as to extend to a surface of the semiconductor substrate 125 to thereby cover a sidewall as well as an upper surface of the transfer electrodes 121b and 121c. When the wiring layers are designed to extend to cover a sidewall of the transfer electrodes 121b and 121c, the wiring layers over the connection portions 112 of the second layer transfer electrodes 122c and 122e could have a greater width, which ensures that a resistance in the wiring layers are reduced, and hence driving pulses are avoided to become dull in a waveform thereof.

There is formed the interlayer insulating film 142 as well as the gate insulating film 126 at a surface of the photodiode regions 110. However, it should be noted that it is not always necessary to form the gate insulating film 126 and the interlayer insulating film 142 below the openings 128 of the electrically conductive photoshield film 124, and that they may be removed, if necessary.

Hereinbelow is explained a method of driving the image sensor in accordance with the above-mentioned first embodiment.

When charges are transferred, a first phase driving pulse $\phi 1$ is applied to the transfer electrodes 121a and 122d disposed at (6N+1)th and (6N+4)th columns, respectively, through the electrically conductive photoshield film 124, a second phase driving pulse $\phi 2$ is applied to the transfer electrodes 122c and 121c disposed at (6N+2)th and (6N+5)th columns, respectively, and a third phase driving pulse $\phi 3$ is applied to the transfer electrodes 121b and 122e disposed at (6N+3)th and (6N+6)th columns, respectively. When a signal charge is read out from the photodiode region 110 to the charge transfer region 111, a read-out pulse $\phi TG$ in addition to the first phase driving pulse $\phi 1$ is applied to the transfer electrodes 121a and 122d disposed at (6N+1)th and (6N+4)th columns, respectively.

Thus, the first embodiment provides a three-phase driving type progressive-scan image sensor with transfer electrodes formed of two layers and an electrically conductive photoshield film formed of one layer.

Hereinbelow is explained the advantageous effects obtained by the above-mentioned first embodiment. The image sensor in accordance with the first embodiment makes it possible to construct a three-phase driving type progressive-scan image sensor with the smaller number of layers of which transfer electrodes are formed than the conventional progressive-scan image sensor. This ensures that a three-phase driving type progressive-scan image sensor can be fabricated with the smaller number of fabrication steps, resulting in reduction in a fabrication cost.

In addition, if the transfer electrodes were formed of polysilicon, it would be possible to omit steps of phosphorus diffusion to be carried out for the purpose of reducing a resistance of transfer electrodes, and of high temperature thermal treatment such as thermal oxidation to be carried out for the purpose of forming interlayer insulating films between transfer electrodes. This ensures that pixel defects such as white scratch.

Furthermore, the semiconductor substrate can have a surface having a smaller aspect ratio and having the less number of steps, which ensures reduction in sensitivity and occurrence of smear, and also ensures that transfer electrodes and an electrically conductive photoshield film can be fabricated in desired shapes, resulting in an increase in a fabrication yield of semiconductor devices.

In addition, since an on-chip color filter and an on-chip micro lens can be fabricated with high accuracy, it is possible to enhance sensitivity of them, and prevent non-uniformity in sensitivity in a plane of a chip, and color mixture among pixels.

Since the number of layers of which the transfer electrodes are formed is reduced, and hence an interlayer capacity in the transfer electrodes is reduced, it is possible to reduce power consumption in the charge transfer regions, and avoid driving pulses applied to the transfer electrodes from becoming dull in a waveform thereof. As a result, a transfer efficiency is enhanced.

The transfer electrodes 121a and 122d occupy a smaller area in a surface of the semiconductor substrate than the conventional transfer electrodes, and have smaller gate capacity and interlayer capacity. A read-out pulse is applied to such transfer electrodes 121a and 122d through the electrically conductive photoshield film 124 having a smaller resistance, when a signal charge is to be read out. Hence, the read-out pulse could have a small time constant defined as a product CR, and have dullness in a waveform thereof to smaller degree. This ensures to read out signal charges at a shorter period of time without improper read-outs.

Embodiment 2

An image sensor in accordance with the second embodiment is explained hereinbelow with reference to FIGS. 6A to 6C. With reference to FIG. 6A, the illustrated image sensor is of an interline transfer type image sensor including a plurality of photodiode regions 210, and a plurality of charge transfer regions 211 for reading signal charges photoelectrically converted in the photodiode regions 210, and transferring the thus photoelectrically converted signal charges in a vertical transfer direction X1. The photodiode regions 210 and the photodiode regions 211 are spaced away from one another in the direction X1, respectively. Hereinafter, spaces formed between the photodiode regions 210 and also between the photodiode regions 211 in the direction X1 are referred to as connection portions 212.

Each of transfer electrodes is comprised of four sections per a pixel. As illustrated in FIG. 6B, on the connection portion 212 disposed between the adjacent charge transfer regions 111 and also between the adjacent charge transfer regions 211 and the adjacent photodiode regions 210 in the direction X1 are formed a transfer electrode 221d disposed at (4N+1)th column and a transfer electrode 221e disposed at (4N+3)th column both of which transfer electrodes are formed of a first gate electrode film. Between the transfer electrodes 221d and 221e both formed of a first gate electrode film are formed a transfer electrode 222f disposed at (4N+2)th column and a transfer electrode 222g disposed at (4N+4)th column both of which transfer electrodes are formed of a second gate electrode film.

The transfer electrode 221d disposed at (4N+1)th column is sandwiched between the photodiode regions 210, and thus are formed in an island shape. The transfer electrodes other than the transfer electrode 221d extend through the connection portions 212, and make electrical connection with a bus line (not illustrated) disposed around a semiconductor substrate 225.

If a wiring layer or a later mentioned electrically conductive photoshield film 224 situated on the connection portions 212 would have a small width, a resistance thereof becomes higher, and hence driving pulses are caused to become dull in a waveform thereof. On the contrary, if the wiring layer would have a great width, openings of the photodiode regions 210 would become narrower with the result of reduction in sensitivity of the wiring layer. Thus, it is preferable that the wiring layer has a width in the range of 0.5 μm to 2μm both inclusive.

As illustrated in FIG. 6B, there is formed an electrically conductive photoshield film 224 over the transfer electrodes 221d, 221e, 222f and 222g so that the charge transfer regions 211 are covered with the electrically conductive photoshield film 224. The electrically conductive photoshield film 224 makes electrical connection with the above-mentioned bus line, and further makes electrical connection with the island-shaped transfer electrodes 221a disposed at (4N+1)th column through a contact hole 227.

The electrically conductive photoshield film 224 may be formed in such a shape as illustrated in FIGS. 5A and 5B.

With reference to FIG. 6B, a gate insulating film 226 such as a thermal oxide film and an oxide-nitride-oxide (ONO) film is formed on the semiconductor substrate 225, and the first layer of which the transfer electrodes 221d and 221e are formed is formed on the gate insulating film 226. These transfer electrodes 221d and 221e are formed by forming a gate electrode film of polysilicon or tungsten silicide by CVD, and patterning the gate electrode film by photolithography and dry etching. Then, there is formed an interlayer insulating film 241 over the transfer electrodes 221d and 221e, for instance, by thermally oxidizing the transfer electrodes 221d and 221e.

Thereafter, the transfer electrodes 222f and 222g constituted of a second layer are formed between the first layer transfer electrodes 221d and 221e. Then, there is formed an interlayer insulating film 242 over the second layer transfer electrodes 222f and 222g, for instance, by thermally oxidizing the second layer transfer electrodes 222f and 222g, or by forming an insulating film by CVD. Then, there is formed the electrically conductive photoshield film 224 over the interlayer insulating film 242 by sputtering or CVD, as illustrated in FIG. 6B. The electrically conductive photoshield film 224 is made of metal such as tungsten and aluminum, or of metal silicide such as tungsten silicide.

As illustrated in FIGS. 6A and 6C, the interlayer insulating film 242 is formed with the contact holes 227 through which the electrically conductive photoshield film 224 makes electrical connection with the transfer electrode 221d disposed at (4N+1)th column. If a channel voltage below the transfer electrode 221d were caused electrodes by making channel voltage below other transfer electrodes by making direct, electrical connection between the electrically conductive photoshield film 224 and the transfer electrode 221d, there may be formed a layer made of metal such as titanium or of metal nitride such as titanium nitride by sputtering or CVD between the electrically conductive photoshield film 224 and the transfer electrode 221d. Such a layer would suppress fluctuation in a channel voltage.

With reference to FIG. 6C, the transfer electrode 221e formed of the first layer is formed on the semiconductor substrate 225 except the photodiode regions 210 with the gate insulating film 226 sandwiched therebetween. The first layer transfer electrode 221e is covered with the interlayer insulating film 241. The transfer electrodes 222f and 222g formed of the second layer are formed on the interlayer insulating film 241 above the first layer transfer electrode 221e. With respect to the wiring layers situated above the connection portions 212 of the second layer transfer electrodes 222f and 222g, it is preferable that a gap between the wiring layers is as small as possible. The wiring layers may be formed so as to extend to a surface of the semiconductor substrate 225 to thereby cover a sidewall as well as an upper surface of the transfer electrode 221e. When the wiring layers are designed to extend to cover a sidewall of the transfer electrode 221e, the wiring layers over the connection portions 212 of the second layer transfer electrodes 222f and 222g could have a greater width, which ensures that a resistance in the wiring layers is reduced, and hence driving pulses are avoided to become dull in a waveform thereof.

There is formed the interlayer insulating film 242 as well as the gate insulating film 226 at a surface of the photodiode regions 210. However, it should be noted that it is not always necessary to form the gate insulating film 226 and the interlayer insulating film 242 below the openings 228 of the electrically conductive photoshield film 224, and that they may be removed, if necessary.

Hereinbelow is explained a method of driving the image sensor in accordance with the above-mentioned second embodiment.

When charges are transferred, a first phase driving pulse φ1 is applied to the transfer electrode 221d disposed at (4N+1)th column through the electrically conductive photoshield film 224, a second phase driving pulse φ2 is applied to the transfer electrode 222f disposed at (4N+2)th column, a third phase driving pulse φ3 is applied to the transfer electrode 221e disposed at (4N+3)th column, and a fourth phase driving pulse φ4 is applied to the transfer electrode 222g disposed at (4N+4)th column. When a signal charge is read out from the photodiode region 210 to the charge transfer region 211, a read-out pulse φTG in addition to the first phase driving pulse φ1 is applied to the transfer electrode 221d disposed at (4N+1)th column.

Thus, the second embodiment provides a four-phase driving type progressive-scan image sensor with transfer electrodes formed of two layers and an electrically conductive photoshield film formed of one layer. The image sensor in accordance with the second embodiment provides the same advantageous effects as those of the image sensor in accordance with the first embodiment except that the second embodiment is of a four-phase driving type, whereas the first embodiment is of a three-phase driving type.

Embodiment 3

An image sensor in accordance with the third embodiment is explained hereinbelow with reference to FIGS. 7A to 7C. With reference to FIG. 7A, the illustrated image sensor is of an interline transfer type image sensor including a plurality of photodiode regions 310, and a plurality of charge transfer regions 311 for reading signal charges photoelectrically converted in the photodiode regions 310, and transferring the thus photoelectrically converted signal charges in a vertical transfer direction indicated with an arrow X1. The photodiode regions 310 and the photodiode regions 311 are spaced away from one another in the direction X1, respectively. Hereinafter, spaces formed between the photodiode regions 310 and also between the photodiode regions 311 in the direction X1 are referred to as connection portions 312.

Each of transfer electrodes is comprised of four sections per two pixels in the direction X1. As illustrated in FIG. 7B, on the connection portion 312 disposed between the adjacent charge transfer regions 311 and also between the adjacent photodiode regions 310 in the direction X1 are formed a transfer electrode 321f disposed at (4N+2)th column and a transfer electrode 321g disposed at (4N+4)th column both of which transfer electrodes are formed of a first gate electrode film. Between the transfer electrodes 321f and 321g are formed a transfer electrode 322h disposed at (4N+1)th column and a transfer electrode 322i disposed at (4N+3)th column both of which transfer electrodes are formed of a second gate electrode film.

As illustrated in FIG. 4B, potential barrier regions 329 are formed in a semiconductor substrate 325 at channels located below the transfer electrodes 322h and 322i both formed of the second gate electrode layer.

The transfer electrode 322h disposed at (4N+1)th column and the transfer electrode 321f at (4N+2)th column are sandwiched between the photodiode regions 310, and thus are formed in an island shape. The transfer electrode 322i disposed at (4N+3)th column and the transfer electrode 321g at (4N+4)th column extend through the connection portions 312, and make electrical connection with a bus line (not illustrated) disposed around the semiconductor substrate 325.

If a wiring layer or a later mentioned electrically conductive photoshield film 324 situated on the connection portions 312 would have a small width, a resistance thereof becomes higher, and hence driving pulses are caused to become dull in a waveform thereof. On the contrary, if the wiring layer would have a great width, openings of the photodiode regions 310 would become narrower with the result of reduction in sensitivity of the wiring layer. Thus, it is preferable that the wiring layer has a width in the range of 0.5 μm to 2 μm both inclusive.

As illustrated in FIG. 7B, there is formed an electrically conductive photoshield film 324 over the transfer electrodes 321f, 321g, 322h and 322i so that the charge transfer regions 311 are covered with the electrically conductive photoshield film 324. The electrically conductive photoshield film 324 makes electrical connection with the above-mentioned bus line (not illustrated), and further makes electrical connection with the island-shaped transfer electrodes 322h and 321f disposed at (4N+1)th and (4N+2)th columns, respectively, through a contact hole 327.

The electrically conductive photoshield film 324 may be formed in such a shape as illustrated in FIGS. 5A and 5B.

With reference to FIG. 7B, a gate insulating film 326 such as a thermal oxide film and an oxide-nitride-oxide (ONO) film is formed on the semiconductor substrate 325, and the first layer of which the transfer electrodes 321f and 321g are formed is formed on the gate insulating film 326. These transfer electrodes 321f and 321g are formed by forming a gate electrode film of polysilicon or tungsten silicide by CVD, and patterning the gate electrode film by photolithography and dry etching. Then, impurities having a conductivity opposite to a conductivity of the channel are ion-implanted into the semiconductor substrate 325 in self-aligned fashion with the first layer transfer electrodes 321f and 321g used as a mask. Thus, the potential barrier regions 329 are formed in the semiconductor substrate 325. Then, there is formed an interlayer insulating film 341 over the transfer electrodes 321f and 321g, for instance, by thermally oxidizing those transfer electrodes 321f and 321g.

Thereafter, the transfer electrodes 322h and 322i formed of a second layer are formed between the first layer transfer electrodes 321f and 321g. Then, there is formed an interlayer insulating film 342 over the second layer transfer electrodes 322h and 322i, for instance, by thermally oxidizing the second layer transfer electrodes 322h and 322i, or by forming an insulating film by CVD. Then, there is formed the electrically conductive photoshield film 324 over the interlayer insulating film 342 by sputtering or CVD, as illustrated in FIG. 7B. The electrically conductive photoshield film 324 is made of metal such as tungsten and aluminum, or of metal silicide such as tungsten silicide.

As illustrated in FIGS. 7A and 7C, the interlayer insulating film 342 is formed with the contact holes 327 through which the electrically conductive photoshield film 324 makes electrical connection with the transfer electrodes 322h and 321f disposed at (4N+1)th and (4N+2)th columns, respectively. If a channel voltage below the transfer electrodes 322h and 322i were caused to shift away from a channel voltage below other transfer electrodes by making direct, electrical connection between the electrically conductive photoshield film 324 and the transfer electrodes 322h and 322i, there may be formed a layer made of metal such as titanium or of metal nitride such as titanium nitride by sputtering or CVD between the electrically conductive photoshield film 324 and the transfer electrodes 322h and 322i. Such a layer would suppress fluctuation in a channel voltage.

With reference to FIG. 7C, the transfer electrode 321g formed of the first layer is formed on the semiconductor substrate 325 except the photodiode regions 310 with the gate insulating film 326 sandwiched therebetween. The first layer transfer electrode 321g is covered with the interlayer insulating film 341. The transfer electrode 322i formed of the second layer is formed on the interlayer insulating film 341 partially above the first layer transfer electrode 321g.

With respect to the wiring layers situated above the connection portions 312 of the second layer transfer electrode 322i, the wiring layers may be formed so as to extend to a surface of the semiconductor substrate 325 to thereby cover a sidewall as well as an upper surface of the first layer transfer electrode 321g. When the wiring layers are designed to extend to cover a sidewall of the transfer electrode 321g, the wiring layers over the connection portions 312 of the second layer transfer electrode 321i has a greater width, which ensures that a resistance in the wiring layers are reduced, and hence driving pulses are avoided to become dull in a waveform thereof.

There is formed the interlayer insulating film 342 as well as the gate insulating film 326 at a surface of the photodiode regions 310. However, it should be noted that it is not always necessary to form the gate insulating film 326 and the interlayer insulating film 342 below the openings 328 of the electrically conductive photoshield film 324, and that they may be removed, if necessary.

Hereinbelow is explained a method of driving the image sensor in accordance with the above-mentioned third embodiment.

When charges are transferred, a first phase driving pulse φ1 is applied to the transfer electrodes 322h and 321f disposed at (4N+1)th and (4N+2)th columns, respectively, through the electrically conductive photoshield film 324, and a second phase driving pulse φ2 is applied to the transfer electrodes 322i and 321g disposed at (4N+3)th and (4N+4)th columns, respectively. When a signal charge is read out from the photodiode region 310 to the charge transfer region 311, a read-out pulse φTG in addition to the first phase driving pulse φ1 is applied to the transfer electrode 322h and 321f disposed at (4N+1)th and (4N+2)th columns, respectively.

Thus, the third embodiment provides a two-phase driving type progressive-scan image sensor with transfer electrodes formed of two layers and an electrically conductive photoshield film formed of one layer. The image sensor in accordance with the third embodiment provides the same advantageous effects as those of the image sensor in accordance with the first embodiment except that the third embodiment is of a two-phase driving type, whereas the first embodiment is of a three-phase driving type.

In addition, since the potential barrier regions can be formed in self-aligned fashion of the first layer transfer electrodes, dispersion in characteristics such as a transfer efficiency, a driving voltage and accumulated charges, caused by misregistration, could be eliminated, which ensures a higher fabrication yield of a semiconductor device.

Furthermore, since charges can be transferred by simple two-phase driving pulses having phases inverted by 180 degrees, it is possible to transfer signal charges at a high speed in a vertical transfer direction than a speed in three- or four-phase driving image sensors. Thus, the third embodiment is suitable for a high frame rate progressive-scan image sensor.

The driving pulses used in the instant embodiment are simple. Hence, an external circuit for operating the image sensor in accordance with the instant embodiment can be constructed in a simple structure, an image-inputting device can be provided at a lower cost and in a smaller size.

Embodiment 4

FIG. 8 is a cross-sectional view of an image sensor in accordance with the fourth embodiment. The image sensor in accordance with the fourth embodiment is almost the same in structure as that of the image sensor in accordance with the first embodiment, but is different only in that the interlayer insulating film 142 in the first embodiment is replaced with an interlayer insulating film 443 having a lower dielectric constant than that of a silicon dioxide film. For instance, the interlayer insulating film 443 may be made of amorphous carbon having a dielectric constant of 2.3, or of SiOF having a dielectric constant of 3.5. When the interlayer insulating film 443 is formed of amorphous carbon, the amorphous carbon film 443 may be formed by CVD employing $CH_4$ or $CF_4$, for instance, as process gases. It is preferable for the amorphous carbon film 433 to have a thickness in the range of 1000 angstroms to 3000 angstroms. When the interlayer insulating film 443 is formed of SiOF, the SiOF film 443 may be formed by CVD employing $SiF_4$ or $SiH_4$, for instance, as process gases. It is preferable for the SiOF film 433 to have a thickness in the range of 1000 angstroms to 3000 angstroms.

Hereinbelow is explained the advantages obtained by the image sensor in accordance with the above-mentioned fourth embodiment. The image sensor in accordance with the fourth embodiment provides advantages, as well as the advantages obtained by the first embodiment, that power consumption can be further reduced, and that the first phase driving pulse φ1 and read-out pulse φTG to be applied to the transfer electrodes 121a and 122d making electrical connection with the electrically conductive photoshield film 124 through the contact hole 127 can be prevented from becoming dull in a waveform thereof, and as a result, incomplete transfer of signal charges and improper read-out can be further reduced. This is because that the use of the interlayer insulating film 433 having a smaller dielectric constant reduces an interlayer capacity between the transfer electrodes and the electrically conductive photoshield film, which ensures that a waveform of the driving pulses and read-out pulses, defined by power consumption represented with $CV^2f$, and a product CR, is avoided from becoming dull.

It should be noted that the interlayer insulating film 443 having a low dielectric constant, such as an amorphous silicon film and a SiOF film, may be employed in the above-mentioned second and third embodiments in place of the interlayer insulating films 242 and 342.

As having been described in connection with the first to fourth embodiments, in accordance with the present invention, at least one transfer electrode is formed being surrounded by the photodiode regions to thereby have an island shape, the electrically conductive photoshield film is formed covering the charge transfer regions above the transfer electrodes, and the island-shaped transfer electrode makes electrical connection with the electrically conductive photoshield film, for instance, through a contact hole.

The above-mentioned third prior art has also suggested an image sensor where one of transfer electrodes is formed in an island shape, and an electrically conductive wiring layer is designed to make electrical connection with the island-shaped transfer electrode. However, the image sensor suggested in the third prior art comprises transfer electrodes formed of two layers, an electrically conductive wiring layer for applying driving pulses to the island-shaped transfer electrode, and a photoshield film for isolating photodiode regions from lights. Namely, the image sensor in the third prior art has to include totally four layers, similarly to the image sensors suggested in the first and second prior art. Hence, the third prior art cannot solve the problems associated with the conventional image sensors, such as a high interlayer capacity, large apparent steps on a surface of a substrate, and the great number of fabrication steps. On the other hand, in accordance with the present invention, the electrically conductive photoshield film is designed to double as an electrically conductive wiring layer, and hence it is possible to omit a step of fabricating one wiring layer.

Hereinbelow are explained the above-mentioned first to fourth embodiments in specific dimensions as embodiments 5 to 8.

Embodiment 5

The image sensor in accordance with the above-mentioned first embodiment is described hereinbelow in specific dimensions as a fifth embodiment. With reference to FIGS. 4B and 4C, the semiconductor substrate 125 is a silicon substrate having an n-type channel layer at a surface thereof An oxide-nitride-oxide (ONO) film as the gate insulating film 126 is formed on the semiconductor substrate 125. The ONO film 126 is designed to have a thickness so that the film 126 is equivalent in a gate capacity to an oxide film having a thickness of 700 angstroms. A unit pixel defined by one photodiode region 110 and one charge transfer region 111 is sized 6.7 μm×6.7 μm. Each of the transfer electrodes is comprised of six sections per two pixels in the vertical transfer direction indicated with an arrow X1.

The transfer electrodes 121a, 121b and 121c disposed at (6N+1)th, (6N+3)th, and (6N+5)th columns, respectively, are formed on the gate insulating film 126 by patterning a polysilicon film as a first layer by means of photolithography and dry etching. The polysilicon film as a first layer is a film having a thickness of 4000 angstroms and also having a sheet resistance reduced to 20–30 Ω/□ by ion-implantation of phosphorus. The interlayer insulating film 141 having a thickness of 2000 angstroms is formed by thermally oxidizing the first layer transfer electrodes 121a, 121b and 121c.

Then, the transfer electrodes 122c, 122d and 122e disposed at (6N+2)th, (6N+4)th, and (6N+6)th columns, respectively, are formed by patterning a polysilicon film as a second layer by means of photolithography and dry etching so that they are located between the first layer transfer electrodes 121a, 121b and 121c. The polysilicon film as a second layer is a film having a thickness of 3000 angstroms and also having a sheet resistance reduced to 20–30Ω/□ by ion-implantation of phosphorus.

The transfer electrodes 121a and 122d disposed at (6N+1)th and (6N+4)th columns, respectively, are surrounded by the photodiode regions 110 to thereby be formed in an island shape. The other transfer electrodes 121b, 121c, 122c and 122e extend through the connection portions 112, and make electrical connection with a bus line (not illustrated) disposed around the semiconductor substrate 125.

The wiring layer doubling as the electrically conductive photoshield film 124 located above the connection portions 112 is designed to have a width of at least 1.0 μm so that a resistance of the wiring layer does not become higher, and that driving pulses do not become dull in a waveform thereof. The interlayer insulating film 142 made of a silicon dioxide film is formed over the second layer transfer electrodes 122c, 122d and 122e by reacting SiH$_4$ and H$_2$O gases with each other at about 700° C. by CVD. The interlayer insulating film 142 located above the transfer electrodes 121a and 122d disposed at (6N+1)th and (6N+4)th columns, respectively, is formed with 0.6 μm×1.2 μm-sized contact holes 127 in order to prevent a contact resistance from becoming too high.

The electrically conductive photoshield film 124 disposed on the interlayer insulating film 142 is formed by CVD of a tungsten film having a thickness of 4000 angstroms, and makes electrical connection with a bus line (not illustrated) disposed around the semiconductor substrate 125, and further with the transfer electrodes 121a and 122d disposed at (6N+1)th and (6N+4)th columns, respectively, through the contact hole 127. As illustrated in FIG. 4A, the electrically conductive photoshield film 124 covers the charge transfer regions 111 and the connection portions 112, and is formed with the openings 128 only above the photodiode regions 110.

A method of driving the above-mentioned image sensor is explained hereinbelow with reference to FIG. 9, which is a timing chart for explaining the operation of the image sensor. A first phase driving pulse φ1 is applied to the transfer electrodes 121a and 122d disposed at (6N+1)th and (6N+4)th columns, respectively, through the electrically conductive photoshield film 124, a second phase driving pulse φ2 is applied to the transfer electrodes 122c and 121c disposed at (6N+2)th and (6N+5)th columns, respectively, and a third phase driving pulse φ3 is applied to the transfer electrodes 121b and 122e disposed at (6N+3)th and (6N+6)th columns, respectively. When a signal charge is read out from the photodiode region 110 to the charge transfer region 111, a read-out pulse φTG in addition to the first phase driving pulse φ1 is applied to the transfer electrodes 121a and 122d disposed at (6N+1)th and (6N+4)th columns, respectively.

Embodiment 6

The image sensor in accordance with the above-mentioned second embodiment is described hereinbelow in specific dimensions as a sixth embodiment. With reference to FIGS. 6B and 6C, the semiconductor substrate 225 is a silicon substrate having an n-type channel layer at a surface thereof An oxide-nitride-oxide (ONO) film as the gate insulating film 226 is formed on the semiconductor substrate 225. The ONO film 226 is designed to have a thickness so that the film 226 is equivalent in a gate capacity to an oxide film having a thickness of 700 angstroms. A unit pixel defined by one photodiode region 210 and one charge transfer region 211 is sized 6.7 μm×6.7 μm. Each of the transfer electrodes is comprised of four sections per a pixel.

The transfer electrodes 221d and 221e disposed at (4N+1)th and (4N+3)th columns, respectively, are formed on the gate insulating film 226 by patterning a polysilicon film as a first layer by means of photolithography and dry etching. The polysilicon film as a first layer is a film having a thickness of 4000 angstroms and also having a sheet resistance reduced to 20–30 Ω/□ by ion-implantation of phosphorus. The interlayer insulating film 241 having a thickness of 2000 angstroms is formed by thermally oxidizing the first layer transfer electrodes 221d and 221e. Then, the transfer electrodes 222f and 222g disposed at (4N+1)th and (4N+4)th columns, respectively, are formed by patterning a polysilicon film as a second layer by means of photolithography and dry etching so that they fill a space therewith between the first layer transfer electrodes 221d and 221e. The polysilicon film as a second layer is a film having a thickness of 3000 angstroms and also having a sheet resistance reduced to 20–30 Ω/□ by ion-implantation of phosphorus.

The transfer electrode 221d disposed at (4N+1)th column is surrounded by the photodiode regions 210 to thereby be formed in an island shape. The other transfer electrodes 221e, 222f and 222g extend through the connection portions 212, and make electrical connection with a bus line (not illustrated) disposed around the semiconductor substrate 225.

The wiring layer doubling as the electrically conductive photoshield film 224 located above the connection portions 212 is designed to have a width of at least 1.0 μm so that a resistance of the wiring layer does not become higher, and that driving pulses do not become dull in a waveform thereof. The interlayer insulating film 242 made of a silicon dioxide film is formed over the second layer transfer electrodes 222f and 222g by reacting SiH$_4$ and H$_2$O gases with each other at about 700° C. by CVD. The interlayer insulating film 242 located above the transfer electrode 221d disposed at (4N+1)th column is formed with 0.6 μm×1.2 μm-sized contact holes 227 in order to prevent a contact resistance from becoming too high.

The electrically conductive photoshield film 224 disposed on the interlayer insulating film 242 is formed by CVD of a tungsten film having a thickness of 4000 angstroms, and makes electrical connection with a bus line (not illustrated) disposed around the semiconductor substrate 225, and further with the transfer electrode 221d disposed at (4N+1)th column through the contact hole 227. As illustrated in FIG. 6A, the electrically conductive photoshield film 224 covers the charge transfer regions 211 and the connection portions 212, and is formed with the openings 228 only above the photodiode regions 210.

A method of driving the above-mentioned image sensor is explained hereinbelow with reference to FIG. 10, which is a timing chart for explaining the operation of the image sensor. A first phase driving pulse φ1 is applied to the transfer electrode 221d disposed at (4N+1)th column through the electrically conductive photoshield film 224, a second phase driving pulse φ2 is applied to the transfer electrode 222f disposed at (4N+2)th columns, a third phase driving pulse φ3 is applied to the transfer electrode 221e disposed at (4N+3)th column, and a fourth phase driving pulse φ4 is applied to the transfer electrode 222g disposed at (4N+4)th column. When a signal charge is read out from the photodiode region 210 to the charge transfer region 211, a read-out pulse φTG in addition to the first phase driving pulse φ1 is applied to the transfer electrode 221d disposed at (4N+1)th column.

Embodiment 7

The image sensor in accordance with the above-mentioned third embodiment is described hereinbelow in specific dimensions as a seventh embodiment. With reference to FIGS. 7B and 7C, the semiconductor substrate 325 is a silicon substrate having an n-type channel layer at a surface thereof. An oxide-nitride-oxide (ONO) film as the gate insulating film 326 is formed on the semiconductor substrate 325. The ONO film 326 is designed to have a thickness so that the film 326 is equivalent in a gate capacity to an oxide film having a thickness of 700 angstroms. A unit pixel defined by one photodiode region 310 nd one charge transfer region 311 is sized 6.7 μm×6.7 μm. Each of the transfer electrodes is comprised of four sections per a pixel.

The transfer electrodes 321f and 321g disposed at (4N+1)th and (4N+4)th columns, respectively, are formed on the gate insulating film 326 by patterning a polysilicon film as a first layer by means of photolithography and dry etching. The polysilicon film as a first layer is a film having a thickness of 4000 angstroms and also having a sheet resistance reduced to 20–30 Ω/□ by ion-implantation of phosphorus. Then, boron is ion-implanted into the semiconductor substrate 325 in self-aligned fashion with the first layer transfer electrodes 321f and 321g used as a mask, to thereby form the potential barrier regions 329 at a surface of the semiconductor substrate 325. The interlayer insulating film 341 having a thickness of 2000 angstroms is formed by thermally oxidizing the first layer transfer electrodes 321f and 321g. Then, the transfer electrodes 322h and 322i disposed at (4N+1)th and (4N+3)th columns, respectively, are formed by patterning a polysilicon film as a second layer by means of photolithography and dry etching so that they fill a space therewith between the first layer transfer electrodes 321f and 321g. The polysilicon film as a second layer is a film having a thickness of 3000 angstroms and also having a sheet resistance reduced to 20–30 Ω/□ ion-implantation of phosphorus.

The transfer electrodes 322h and 321f disposed at (4N+1)th and (4N+2)th columns are surrounded by the photodiode regions 310 to thereby be formed in an island shape. The transfer electrodes 322i and 321g disposed at (4N+3)th and (4N+4)th columns, respectively, extend through the connection portions 312, and make electrical connection with a bus line (not illustrated) disposed around the semiconductor substrate 325.

The wiring layer doubling as the electrically conductive photoshield film 324 located above the connection portions 312 is designed to have a width of at least 1.0 μm so that a resistance of the wiring layer does not become higher, and that driving pulses do not become dull in a waveform thereof. The interlayer insulating film 342 made of a silicon dioxide film is formed over the second layer transfer electrodes 322h and 322i by reacting SiH$_4$ and H$_2$O gases with each other at about 700° C. by CVD. The interlayer insulating film 342 located above the transfer electrodes 322h and 321f disposed at (4N+1)th and (4N+2)th columns is formed with 0.6 μm×1.2 μm-sized contact holes 327 in order to prevent a contact resistance from becoming too high.

The electrically conductive photoshield film 324 disposed on the interlayer insulating film 342 is formed by CVD of a tungsten film having a thickness of 4000 angstroms, and makes electrical connection with the above-mentioned bus line, and further with the transfer electrodes 322h and 321f disposed at (4N+1)th and (4N+2)th columns through the contact holes 327. As illustrated in FIG. 7A, the electrically conductive photoshield film 324 covers the charge transfer regions 311 and the connection portions 312, and is formed with the openings 328 only above the photodiode regions 310.

A method of driving the above-mentioned image sensor is explained hereinbelow with reference to FIG. 11, which is a timing chart for explaining the operation of the image sensor. A first phase driving pulse φ1 is applied to the transfer electrodes 322h and 321f disposed at (4N+1)th and (4N+2)th columns through the electrically conductive photoshield film 324, and a second phase driving pulse φ2 is applied to the transfer electrodes 322i and 321g disposed at (4N+3)th and (4N+4)th columns. When a signal charge is read out from the photodiode region 310 to the charge transfer region 311, a read-out pulse φTG in addition to the first phase driving pulse φ1 is applied to the transfer electrodes 322h and 321f disposed at (4N+1)th and (4N+2)th columns.

Embodiment 8

The image sensor in accordance with the above-mentioned fourth embodiment is described hereinbelow in specific dimensions as a eighth embodiment. With reference to FIG. 8, the image sensor in accordance with the eighth embodiment is almost the same in structure as that of the image sensor in accordance with the fifth embodiment, but is different only in that the interlayer insulating film 142 is replaced with an interlayer insulating film 443 having a lower dielectric constant than that of a silicon dioxide film. For instance, the interlayer insulating film 443 may be made of amorphous carbon having a dielectric constant of 2.3, or of SiOF having a dielectric constant of 3.5. When the interlayer insulating film 443 is formed of amorphous carbon, the amorphous carbon film 443 may be formed by CVD employing CH$_4$ or CF$_4$, gases at a gas flow rate of 50 sccm at 100° C. by a thickness of 2000 angstroms. When the interlayer insulating film 443 is formed of SiOF, the SiOF film 443 may be formed by CVD employing SiF$_4$ or SiH$_4$ gases at a gas flow rate of 70 sccm at 400° C. by a thickness of 2000 angstroms.

While the present invention has been described in connection with certain preferred embodiments, the present invention provides advantages as follows.

The first advantage is that the present invention makes it possible to fabricate a progressive-scan image sensor with the smaller number of fabrication steps than those of the conventional methods of fabricating an image sensor. Thus, an image sensor used for a digital TV set and a computer-inputting camera can be fabricated at lower costs. This is because that the image sensor in accordance with the present invention includes the smaller number of layers of which transfer electrodes are formed than the conventional progressive-scan image sensor by electrically connecting an island-shaped transfer electrode to an electrically conductive photoshield film, and by applying a driving pulse to the island-shaped transfer electrode through the electrically conductive photoshield film.

The second advantage is that the number of high temperature process steps such as phosphorus diffusion and thermal oxidation can be decreased by forming transfer electrodes of polysilicon. Hence, it is possible to avoid pixel defects such as white scratch. This is because the image sensor in accordance with the present invention is constructed of the smaller number of layers of which transfer electrodes are formed than the conventional progressive-scan image sensor.

The third advantage is that an on-chip color filter and an on-chip micro lens can be fabricated with high accuracy. Hence, it is possible to enhance sensitivity of an image sensor, reduce smear, and prevent non-uniformity in sensitivity in a plane of a chip and color mixture among pixels. This is because the image sensor in accordance with the present invention can be fabricated with the smaller number of layers of which transfer electrodes are formed than that of the conventional image sensor, which ensures that a semiconductor substrate can have a surface having a smaller aspect ratio and having the less number of steps.

The fourth advantage is that transfer electrodes and an electrically conductive photoshield film can be fabricated with high accuracy. Hence, short-circuit would not occur among transfer electrodes and an electrically conductive photoshield film, ensuring enhancement in a fabrication yield of a semiconductor device. This is because the image sensor in accordance with the present invention can be fabricated with the smaller number of layers of which transfer electrodes are formed than that of the conventional image sensor, which ensures that a semiconductor substrate can have a surface having a smaller aspect ratio and having the less number of steps.

The fifth advantage is that power consumption can be reduced. Hence, the image sensor in accordance with the present invention can be operated with a cell, which ensures that the image sensor is incorporated in a handy image-input device. This is because the image sensor in accordance with the present invention can be fabricated with the smaller number of layers of which transfer electrodes are formed than that of the conventional image sensor, and because the interlayer insulating film between the electrically conductive photoshield film and the transfer electrodes is designed to have a low dielectric constant to cause an interlayer capacity of the transfer electrodes to be reduced.

The sixth advantage is that the image sensor in accordance with the present invention prevents driving pulses and read-out pulses from becoming dull in a waveform thereof to thereby suppress incomplete transfer and improper read-out. Hence, it is possible to prevent deterioration in vertical resolution and occurrence of after images, and obtain images with less non-uniformity in pixel. This is because the image sensor in accordance with the present invention can be fabricated with the smaller number of layers of which transfer electrodes are formed than that of the conventional image sensor, and because the interlayer insulating film between the electrically conductive photoshield film and the transfer electrodes is designed to have a low dielectric constant to cause an interlayer capacity of the transfer electrodes to be reduced.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-296760 filed on Nov. 8, 1996 including specification, claims, drawings and summary is incorporated herein by reference in its entirety.

What is claimed is:

1. An imager sensor comprising:
   (a) a semiconductor substrate;
   (b) a plurality of photodiode regions arranged on said semiconductor substrate in row and column directions;
   (c) a plurality of charge transfer regions each disposed at a space between said photodiode regions in said row direction, said charge transfer regions transferring in said row direction signal charges generated from said photodiode regions; and
   (d) an electrically conductive photoshield film covering said charge transfer regions therewith,
   each of said charge transfer regions comprising at least two layers from which transfer electrodes are formed,
   each of said charge transfer regions including at least three independent transfer electrodes per a photodiode region, at least one of said three independent transfer electrodes being surrounded by said photodiode regions to be formed in an isolated island shape, the rest of said three independent transfer electrodes extending through a space between said photodiode regions in said column direction, and making electrical connection with a bus line disposed outside said semiconductor substrate,
   said electrically conductive photoshield film making electrical connection with both said at least one of said three independent transfer electrodes and said bus line, a driving pulse being applied through said electrically conductive photoshield film.

2. The image sensor as set forth in claim 1, wherein said electrically conductive photoshield film makes electrical connection with said at least one of said three independent transfer electrodes through a contact hole.

3. The image sensor as set forth in claim 1, wherein an interlayer film formed between said electrically conductive photoshield film and said transfer electrodes is an insulating film having a dielectric constant smaller than 3.9.

4. The image sensor as set forth in claim 3, wherein said interlayer film is an amorphous carbon film.

5. The image sensor as set forth in claim 3, wherein said interlayer film is a SiOF film.

6. The image sensor as set forth in claim 3, wherein said interlayer film has a thickness in the range of 1000 angstroms to 3000 angstroms both inclusive.

7. The image sensor as set forth in claim 1, wherein an interlayer film formed between said electrically conductive photoshield film and said transfer electrodes is an insulating film having a smaller dielectric constant than that of a silicon dioxide film.

8. An imager sensor comprising:
   (a) a semiconductor substrate;
   (b) a plurality of photodiode regions arranged on said semiconductor substrate in row and column directions;
   (c) a plurality of charge transfer regions each disposed at a space between said photodiode regions in said row direction, said charge transfer regions transferring in said row direction signal charges generated from said photodiode regions; and
   (d) an electrically conductive photoshield film covering said charge transfer regions therewith,
   each of said charge transfer regions comprising at least two layers from which transfer electrodes are formed,
   each of said charge transfer regions including six independent transfer electrodes per two photodiode regions in said row direction,
   transfer electrodes disposed at (6N+1)th and (6N+4)th columns where N is zero or a positive integer being surrounded by said photodiode regions to be formed in an isolated island shape, and making electrical connection with said electrically conductive photoshield film, the rest of said six independent transfer electrodes extending through a space between said photodiode regions in said column direction, and making electrical connection with a bus line disposed outside said semiconductor substrate, a driving pulse being applied through said electrically conductive photoshield film, transfer electrodes disposed at (6N+1)th, (6N+3)th and (6N+5)th columns being formed of a first gate electrode film, and transfer electrodes disposed at (6N+2)th, (6N+4)th and (6N+6)th columns being formed of a second gate electrode film.

9. The image sensor as set forth in claim 8, wherein said transfer electrodes disposed at (6N+1)th and (6N+4)th columns make electrical connection with said electrically conductive photoshield film through a contact hole.

10. The image sensor as set forth in claim 8, wherein an interlayer film formed between said electrically conductive photoshield film and said transfer electrodes is an insulating film having a dielectric constant smaller than 3.9.

11. The image sensor as set forth in claim 10, wherein said interlayer film is an amorphous carbon film.

12. The image sensor as set forth in claim 10, wherein said interlayer film is a SiOF film.

13. The image sensor as set forth in claim 10, wherein said interlayer film has a thickness in the range of 1000 angstroms to 3000 angstroms both inclusive.

14. The image sensor as set forth in claim 8, wherein an interlayer film formed between said electrically conductive photoshield film and said transfer electrodes is an insulating film having a smaller dielectric constant than that of a silicon dioxide film.

15. The image sensor as set forth in claim 8, wherein said transfer electrodes disposed at (6N+2)th, (6N+4)th and (6N+6)th columns are formed in spaces between said transfer electrodes disposed at (6N+1)th, (6N+3)th and (6N+5)th columns.

16. The image sensor as set forth in claim 8, wherein said electrically conductive photoshield film disposed above said space between said photodiode regions in said column direction has a width in the range of 0.5 μm to 2 μm both inclusive.

17. The image sensor as set forth in claim 8, wherein said electrically conductive photoshield film is formed in stripes in said row direction so as to cover only said charge transfer regions.

18. The image sensor as set forth in claim 8, wherein said electrically conductive photoshield film is formed so as to cover said charge transfer regions and said space between said photodiode regions in said column direction, and so as to have openings above said photodiode regions.

19. The image sensor as set forth in claim 8, wherein said electrically conductive photoshield film on said transfer electrodes formed of said second gate electrode film is formed so as to cover a sidewall of said transfer electrodes formed of said first gate electrode film.

20. An imager sensor comprising:

(a) a semiconductor substrate;

(b) a plurality of photodiode regions arranged on said semiconductor substrate in row and column directions;

(c) a plurality of charge transfer regions each disposed at a space between said photodiode regions in said row direction, said charge transfer regions transferring in said row direction signal charges generated from said photodiode regions; and (d) an electrically conductive photoshield film covering said charge transfer regions therewith, each of said charge transfer regions comprising at least two layers from which transfer electrodes are formed, each of said charge transfer regions including four independent transfer electrodes per a photodiode region, a transfer electrode disposed at (4N+1)th column where N is zero or a positive integer being surrounded by said photodiode regions to be formed in an isolated island shape, and making electrical connection with said electrically conductive photoshield film, the rest of said four independent transfer electrodes extending through a space between said photodiode regions in said column direction, and making electrical connection with a bus line disposed outside said semiconductor substrate, a driving pulse being applied through said electrically conductive photoshield film, transfer electrodes disposed at (4N+1)th and (4N+3)th columns being formed of a first gate electrode film, and transfer electrodes disposed at (4N+2)th and (4N+4)th columns being formed of a second gate electrode film.

21. The image sensor as set forth in claim 20, wherein said transfer electrode disposed at (4N+1)th column makes electrical connection with said electrically conductive photoshield film through a contact hole.

22. The image sensor as set forth in claim 20, wherein an interlayer film formed between said electrically conductive photoshield film and said transfer electrodes is an insulating film having a dielectric constant smaller than 3.9.

23. The image sensor as set forth in claim 22, wherein said interlayer film is an amorphous carbon film.

24. The image sensor as set forth in claim 22, wherein said interlayer film is a SiOF film.

25. The image sensor as set forth in claim 22, wherein said interlayer film has a thickness in the range of 1000 angstroms to 3000 angstroms both inclusive.

26. The image sensor as set forth in claim 20, wherein an interlayer film formed between said electrically conductive photoshield film and said transfer electrodes is an insulating film having a smaller dielectric constant than that of a silicon dioxide film.

27. The image sensor as set forth in claim 20, wherein said transfer electrodes disposed at (4N+1)th and (4N+3)th columns are formed in spaces between said transfer electrodes disposed at (4N+2)th and (4N+4)th columns.

28. The image sensor as set forth in claim 20, wherein said electrically conductive photoshield film disposed above said space between said photodiode regions in said column direction has a width in the range of 0.5 μm to 2 μm both inclusive.

29. The image sensor as set forth in claim 20, wherein said electrically conductive photoshield film is formed in stripes in said row direction so as to cover only said charge transfer regions.

30. The image sensor as set forth in claim 20, wherein said electrically conductive photoshield film is formed so as to cover said charge transfer regions and said space between said photodiode regions in said column direction, and so as to have openings above said photodiode regions.

31. The image sensor as set forth in claim 20, wherein said electrically conductive photoshield film on said transfer electrodes formed of said second gate electrode film is formed so as to cover a sidewall of said transfer electrodes formed of said first gate electrode film.

32. An imager sensor comprising:
(a) a semiconductor substrate;
(b) a plurality of photodiode regions arranged on said semiconductor substrate in row and column directions;
(c) a plurality of charge transfer regions each disposed at a space between said photodiode regions in said row direction, said charge transfer regions transferring in said row direction signal charges generated from said photodiode regions; and
(d) an electrically conductive photoshield film covering said charge transfer regions therewith, each of said charge transfer regions comprising at least two layers from which transfer electrodes are formed, each of said charge transfer regions including four independent transfer electrodes per a photodiode region, transfer electrodes disposed at (4N+1)th and (4N+2)th columns where N is zero or a positive integer being surrounded by said photodiode regions to be formed in an isolated island shape, and making electrical connection with said electrically conductive photoshield film, transfer electrodes disposed at (4N+3)th and (4N+4)th columns extending through a space between said photodiode regions in said column direction, and making electrical connection with a bus line disposed outside said semiconductor substrate, a driving pulse being applied through said electrically conductive photoshield film, transfer electrodes disposed at (4N+2)th and (4N+4)th columns being formed of a first gate electrode film, and transfer electrodes disposed at (4N+1)th and (4N+3)th columns being formed of a second gate electrode film, said image sensor further comprising potential barrier regions in said semiconductor substrate below said transfer electrodes disposed at (4N+1)th and (4N+3)th columns.

33. The image sensor as set forth in claim 32, wherein said transfer electrodes disposed at (4N+1)th and (4N+2)th columns make electrical connection with said electrically conductive photoshield film through a contact hole.

34. The image sensor as set forth in claim 32, wherein an interlayer film formed between said electrically conductive photoshield film and said transfer electrodes is an insulating film having a dielectric constant smaller than 3.9.

35. The image sensor as set forth in claim 34, wherein said interlayer film is an amorphous carbon film.

36. The image sensor as set forth in claim 34, wherein said interlayer film is a SiOF film.

37. The image sensor as set forth in claim 34, wherein said interlayer film has a thickness in the range of 1000 angstroms to 3000 angstroms both inclusive.

38. The image sensor as set forth in claim 32, wherein an interlayer film formed between said electrically conductive photoshield film and said transfer electrodes is an insulating film having a smaller dielectric constant than that of a silicon dioxide film.

39. The image sensor as set forth in claim 32, wherein transfer electrodes disposed at (4N+1)th and (4N+3)th columns are formed in spaces between said transfer electrodes disposed at (4N+2)th and (4N+4)th columns.

40. The image sensor as set forth in claim 32, wherein said electrically conductive photoshield film disposed above said space between said photodiode regions in said column direction has a width in the range of 0.5 µm to 2 µm both inclusive.

41. The image sensor as set forth in claim 32, wherein said electrically conductive photoshield film is formed in stripes in said row direction so as to cover only said charge transfer regions.

42. The image sensor as set forth in claim 32, wherein said electrically conductive photoshield film is formed so as to cover said charge transfer regions and said space between said photodiode regions in said column direction, and so as to have openings above said photodiode regions.

43. The image sensor as set forth in claim 32, wherein said electrically conductive photoshield film on said transfer electrodes formed of said second gate electrode film is formed so as to cover a sidewall of said transfer electrodes formed of said first gate electrode film.

44. The image sensor as set forth in claim 32, wherein said potential barrier regions are formed by ion-implanting impurities into said semiconductor substrate in self-aligned manner about said transfer electrodes disposed at (4N+2)th and (4N+4)th columns.

45. A method of driving an image sensor comprising:
(a) a semiconductor substrate;
(b) a plurality of photodiode regions arranged on said semiconductor substrate in row and column directions;
(c) a plurality of charge transfer regions each disposed at a space between said photodiode regions in said row direction, said charge transfer regions transferring in said row direction signal charges generated from said photodiode regions; and
(d) an electrically conductive photoshield film covering said charge transfer regions therewith, each of said charge transfer regions comprising at least two layers from which transfer electrodes are formed, each of said charge transfer regions including six independent transfer electrodes per two photodiode regions in said row direction, transfer electrodes disposed at (6N+1)th and (6N+4)th columns where N is zero or a positive integer being surrounded by said photodiode regions to be formed in an isolated island shape, and making electrical connection with said electrically conductive photoshield film, the rest of said six independent transfer electrodes extending through a space between said photodiode regions in said column direction, and making electrical connection with a bus line disposed outside said semiconductor substrate, a driving pulse being applied through said electrically conductive photoshield film, transfer electrodes disposed at (6N+1)th, (6N+3)th and (6N+5)th columns being formed of a first gate electrode film, and transfer electrodes disposed at (6N+2)th, (6N+4)th and (6N+6)th columns being formed of a second gate electrode film, said method comprising the steps of:
(a) applying a first phase driving pulse to said transfer electrodes disposed at (6N+1)th and (6N+4)th columns;
(b) applying a second phase driving pulse to said transfer electrodes disposed at (6N+2)th and (6N+5)th columns; and
(c) applying a third phase driving pulse to said transfer electrodes disposed at (6N+3)th and (6N+6)th columns.

46. The method as set forth in claim 45, wherein a read-out pulse is applied to said transfer electrodes disposed at (6N+1)th and (6N+4)th columns through said electrically conductive photoshield film to read signal charges from said photodiode region including said transfer electrodes disposed at (6N+1)th and (6N+4)th columns.

47. A method of driving an imager sensor comprising:

(a) a semiconductor substrate;

(b) a plurality of photodiode regions arranged on said semiconductor substrate in row and column directions;

(c) a plurality of charge transfer regions each disposed at a space between said photodiode regions in said row direction, said charge transfer regions transferring in said row direction signal charges generated from said photodiode regions; and (d) an electrically conductive photoshield film covering said charge transfer regions therewith, each of said charge transfer regions comprising at least two layers from which transfer electrodes are formed, each of said charge transfer regions including four independent transfer electrodes per a photodiode region, a transfer electrode disposed at (4N+1)th column where N is zero or a positive integer being surrounded by said photodiode regions to be formed in an isolated island shape, and making electrical connection with said electrically conductive photoshield film, the rest of said six independent transfer electrodes extending through a space between said photodiode regions in said column direction, and making electrical connection with a bus line disposed outside said semiconductor substrate, a driving pulse being applied through said electrically conductive photoshield film, transfer electrodes disposed at (4N+1)th and (4N+3)th columns being formed of a first gate electrode film, and transfer electrodes disposed at (4N+2)th and (4N+4)th columns being formed of a second gate electrode film.

said method comprising the steps of:

(a) applying a first phase driving pulse to said transfer electrode disposed at (4N+1)th column;

(b) applying a second phase driving pulse to said transfer electrode disposed at (4N+2)th column;

(c) applying a third phase driving pulse to said transfer electrode disposed at (4N+3)th column; and (d) applying a first phase driving pulse to said transfer electrode disposed at (4N+4)th column.

48. The method as set forth in claim 47, wherein a read-out pulse is applied to said transfer electrode disposed at (4N+1)th column through said electrically conductive photoshield film to read signal charge from said photodiode region including said transfer electrode disposed at (4N+1)th column.

49. A method of driving an imager sensor comprising:

(a) a semiconductor substrate;

(b) a plurality of photodiode regions arranged on said semiconductor substrate in row and column directions;

(c) a plurality of charge transfer regions each disposed at a space between said photodiode regions in said row direction, said charge transfer regions transferring in said row direction signal charges generated from said photodiode regions; and (d) an electrically conductive photoshield film covering said charge transfer regions therewith, each of said charge transfer regions comprising at least two layers from which transfer electrodes are formed, each of said charge transfer regions including four independent transfer electrodes per a photodiode region, transfer electrodes disposed at (4N+1)th and (4N+2)th columns where N is zero or a positive integer being surrounded by said photodiode regions to be formed in an isolated island shape, and making electrical connection with said electrically conductive photoshield film, transfer electrodes disposed at (4N+3)th and (4N+4)th columns extending through a space between said photodiode regions in said column direction, and making electrical connection with a bus line disposed outside said semiconductor substrate, a driving pulse being applied through said electrically conductive photoshield film, transfer electrodes disposed at (4N+2)th and (4N+4)th columns being formed of a first gate electrode film, and transfer electrodes disposed at (4N+1)th and (4N+3)th columns being formed of a second gate electrode film.

said image sensor further comprising potential barrier regions in said semiconductor substrate below said transfer electrodes disposed at (4N+1)th and (4N+3)th columns, said method comprising the steps of:

(a) applying a first phase driving pulse to said transfer electrodes disposed at (4N+1)th and (4N+2)th columns; and (b) applying a second phase driving pulse to said transfer electrodes disposed at (4N+3)th and (4N+4)th columns.

50. The method as set forth in claim 49, wherein a read-out pulse is applied to said transfer electrodes disposed at (4N+1)th and (4N+2)th columns through said electrically conductive photoshield film to read signal charges from said photodiode region including said transfer electrodes disposed at (4N+1)th and (4N+2)th columns.

* * * * *